(12) United States Patent
Hendrix et al.

(10) Patent No.: US 12,018,382 B2
(45) Date of Patent: Jun. 25, 2024

(54) COATINGS FOR ENHANCEMENT OF PROPERTIES AND PERFORMANCE OF SUBSTRATE ARTICLES AND APPARATUS

(71) Applicant: Entegris, Inc., Billerica, MA (US)

(72) Inventors: Bryan C. Hendrix, Danbury, CT (US); David W. Peters, Kingsland, TX (US); Weimin Li, New Milford, CT (US); Carlo Waldfried, Middleton, MN (US); Richard A. Cooke, Framingham, MA (US); Nilesh Gunda, North Chelmsford, MA (US); I-Kuan Lin, Bedford, MA (US)

(73) Assignee: ENTEGRIS, INC., Billerica, MA (US)

( * ) Notice: Subject to any disclaimer, the term of this patent is extended or adjusted under 35 U.S.C. 154(b) by 246 days.

(21) Appl. No.: 16/123,149

(22) Filed: Sep. 6, 2018

(65) Prior Publication Data
US 2019/0100842 A1    Apr. 4, 2019

Related U.S. Application Data

(63) Continuation of application No. 15/550,630, filed as application No. PCT/US2016/017910 on Feb. 13, 2016, now abandoned.
(Continued)

(51) Int. Cl.
*C23C 16/44*      (2006.01)
*B01D 39/20*      (2006.01)
(Continued)

(52) U.S. Cl.
CPC ........ *C23C 28/044* (2013.01); *B01D 39/2027* (2013.01); *B01D 67/00* (2013.01);
(Continued)

(58) Field of Classification Search
None
See application file for complete search history.

(56) References Cited

U.S. PATENT DOCUMENTS

4,680,085 A * 7/1987 Vijan .................. H01L 27/1214
                                                    438/719
4,708,919 A * 11/1987 Shimkunas .............. G03F 1/22
                                                    378/34
(Continued)

FOREIGN PATENT DOCUMENTS

CN    1647258 A    7/2005
CN    1832104 A    9/2006
(Continued)

OTHER PUBLICATIONS

Dai, Songyuan, Membrane Solar Battery Key Science and Technology, p. 373, Jan. 2013.
(Continued)

*Primary Examiner* — Mandy C Louie

(57) ABSTRACT

Coatings applicable to a variety of substrate articles, structures, materials, and equipment are described. In various applications, the substrate includes metal surface susceptible to formation of oxide, nitride, fluoride, or chloride of such metal thereon, wherein the metal surface is configured to be contacted in use with gas, solid, or liquid that is reactive therewith to form a reaction product that deleterious to the substrate article, structure material, or equipment. The metal surface is coated with a protective coating preventing reaction of the coated surface with the reactive gas, and/or otherwise improving the electrical, chemical, thermal, or structural properties of the substrate article or equipment. Various methods of coating the metal surface are described, and for selecting the coating material that is utilized.

3 Claims, 22 Drawing Sheets

Related U.S. Application Data

(60) Provisional application No. 62/221,594, filed on Sep. 21, 2015, provisional application No. 62/188,333, filed on Jul. 2, 2015, provisional application No. 62/167,890, filed on May 28, 2015, provisional application No. 62/116,181, filed on Feb. 13, 2015.

(51) Int. Cl.
```
B01D 67/00      (2006.01)
C23C 14/24      (2006.01)
C23C 14/50      (2006.01)
C23C 16/04      (2006.01)
C23C 16/40      (2006.01)
C23C 16/455     (2006.01)
C23C 16/56      (2006.01)
C23C 28/04      (2006.01)
```

(52) U.S. Cl.
CPC .......... *C23C 14/243* (2013.01); *C23C 14/50* (2013.01); *C23C 16/042* (2013.01); *C23C 16/403* (2013.01); *C23C 16/404* (2013.01); *C23C 16/405* (2013.01); *C23C 16/4404* (2013.01); *C23C 16/4412* (2013.01); *C23C 16/45525* (2013.01); *C23C 16/45555* (2013.01); *C23C 16/56* (2013.01); *C23C 28/042* (2013.01); *B01D 2239/0478* (2013.01); *B01D 2239/1216* (2013.01)

(56) References Cited

U.S. PATENT DOCUMENTS

| | | | |
|---|---|---|---|
| 4,877,480 A * | 10/1989 | Das | H01F 41/34 430/323 |
| 4,888,114 A | 12/1989 | Gaddis | |
| 5,114,447 A | 5/1992 | Davis | |
| 5,487,771 A | 1/1996 | Zeller | |
| 5,942,039 A | 8/1999 | Kholodenko et al. | |
| 6,020,241 A * | 2/2000 | You | H01L 27/1126 257/390 |
| 6,416,577 B1 | 7/2002 | Suntoloa et al. | |
| 7,123,383 B2 | 10/2006 | Hattori | |
| 7,846,291 B2 | 12/2010 | Otsuki | |
| 7,879,179 B2 | 2/2011 | Otsuki | |
| 7,915,170 B2 * | 3/2011 | Ruo Qing | H01L 21/31144 438/694 |
| 8,623,770 B1 | 1/2014 | Gao et al. | |
| 8,859,040 B2 | 10/2014 | Dodge | |
| 8,932,381 B2 | 1/2015 | Zeller | |
| 2003/0000891 A1 | 1/2003 | Gill | |
| 2004/0266204 A1* | 12/2004 | Lim | H01L 21/0276 257/E21.314 |
| 2006/0251874 A1 | 11/2006 | McClure | |
| 2007/0116872 A1 | 5/2007 | Li | |
| 2008/0003768 A1 | 1/2008 | Oh | |
| 2008/0049428 A1 | 2/2008 | Cunningham | |
| 2008/0254312 A1 | 10/2008 | Groenen | |
| 2008/0274282 A1 | 11/2008 | Bent et al. | |
| 2008/0317962 A1 | 12/2008 | Hayes | |
| 2009/0041986 A1* | 2/2009 | Zhang | B81C 1/00103 264/300 |
| 2009/0081356 A1 | 3/2009 | Fedorovskaya | |
| 2009/0159005 A1 | 6/2009 | Deacon | |
| 2009/0194233 A1* | 8/2009 | Tamura | C23C 16/403 427/454 |
| 2010/0009132 A1 | 1/2010 | Cheng | |
| 2010/0123993 A1 | 5/2010 | Laor | |
| 2010/0255198 A1 | 10/2010 | Cleary | |
| 2011/0076401 A1* | 3/2011 | Chao | C23C 16/4404 427/292 |
| 2011/0244693 A1 | 10/2011 | Tamura et al. | |
| 2012/0052216 A1 | 3/2012 | Hanawa et al. | |
| 2012/0144640 A1 | 6/2012 | Shih et al. | |
| 2012/0318457 A1 | 12/2012 | Nguyen | |
| 2013/0064973 A1 | 3/2013 | Chen et al. | |
| 2013/0112554 A1 | 5/2013 | Rasheed et al. | |
| 2013/0183445 A1 | 6/2013 | Rahtu et al. | |
| 2013/0203264 A1 | 8/2013 | Liu | |
| 2013/0209006 A1 | 8/2013 | Kolev et al. | |
| 2013/0267068 A1 | 10/2013 | Hanaoka | |
| 2013/0305673 A1 | 11/2013 | Zeller | |
| 2014/0158613 A1 | 6/2014 | Weimer | |
| 2014/0174955 A1 | 6/2014 | Sasagawa | |
| 2014/0287230 A1 | 9/2014 | Walls et al. | |
| 2014/0377504 A1* | 12/2014 | Sun | H01J 37/32495 204/192.1 |
| 2014/0377963 A1 | 12/2014 | Ellinger | |
| 2015/0147482 A1* | 5/2015 | Kang | C23C 16/4404 427/535 |
| 2015/0184296 A1* | 7/2015 | Xu | C23C 16/4404 428/688 |
| 2017/0175284 A1* | 6/2017 | Sun | C25D 17/001 |

FOREIGN PATENT DOCUMENTS

| | | |
|---|---|---|
| CN | 103050376 A | 4/2013 |
| CN | 103811312 A | 5/2014 |
| CN | 103958027 A | 7/2014 |
| JP | 62270473 A | 11/1987 |
| JP | 02188614 A | 7/1990 |
| JP | 0957030 A | 3/1997 |
| JP | 0985028 A | 3/1997 |
| JP | 10272317 A | 10/1998 |
| JP | 1121601 A | 1/1999 |
| JP | 11104421 A | 4/1999 |
| JP | 11222679 | 8/1999 |
| JP | H11-222679 | 8/1999 |
| JP | H11-222679 A | 8/1999 |
| JP | 11345772 A | 12/1999 |
| JP | 1999345772 | 12/1999 |
| JP | 2000042320 A | 2/2000 |
| JP | 2001185533 A | 7/2001 |
| JP | 2002-110546 A | 4/2002 |
| JP | 2002110546 A | 4/2002 |
| JP | 2002314072 A | 10/2002 |
| JP | 2004-003022 A | 1/2004 |
| JP | 2004003022 A | 1/2004 |
| JP | 2005306625 A | 11/2005 |
| JP | 2006169617 A | 6/2006 |
| JP | 2006279058 A | 10/2006 |
| JP | 2007005545 | 1/2007 |
| JP | 2008-120654 | 5/2008 |
| JP | 2008-120654 A | 5/2008 |
| JP | 2008120654 | 5/2008 |
| JP | 2009-256800 A | 11/2009 |
| JP | 2009256800 A | 11/2009 |
| JP | 2010540773 A | 12/2010 |
| JP | 2013-536590 A | 9/2013 |
| JP | 2013536590 A | 9/2013 |
| JP | 2013235978 A | 11/2013 |
| KR | 100259679 B1 | 6/2000 |
| KR | 1002596790000 | 6/2000 |
| KR | 20040101330 A | 12/2004 |
| WO | 2008/028170 | 3/2008 |
| WO | 2008034190 A1 | 3/2008 |
| WO | 2010093761 A1 | 8/2010 |
| WO | 2011133207 A2 | 10/2011 |
| WO | 2013148444 A1 | 10/2013 |
| WO | 2014/044924 A1 | 3/2014 |
| WO | 2014044924 A1 | 3/2014 |
| WO | 2016/131024 | 8/2016 |

OTHER PUBLICATIONS

Fengbin Li et al: "Modification of ceramic membranes for pore structure tailoring: The atomic layer deposition route", Journal of Membrane Science, Elsevier BV, NL, vol. 397, Jan. 6, 2012 (Jan. 6, 2012).

Kemell M et al: "Coating of highly porous fiber matrices by atomic layer deposition", Chemical Vapor Deposition, Wiley-VCH Verlag,

(56) References Cited

OTHER PUBLICATIONS

Weinheim, DE, vol. 14, No. 11/12, Nov. 1, 2008 (Nov. 1, 2008).
A. J. M. Mackus et al: "The use of atomic layer deposition in advanced nanopatterning", Nanoscale, vol. 6, No. 19, Jan. 1, 2014 (Jan. 1, 2014), pp. 10941-10960, XP055552437, United Kingdom ISSN: 2040-3364, DOI: 10.1039/C4NR01954G p. 10947; figure 6.
E. Marin et al. "Tribological Properties of Nanometric Atomic Layer Depositions Applied on AISI 420 Stainless Steel", Tribology in Industry, vol. 35, No. 3, 2013, pp. 208-216.
Rubow, K.L., et al., "A Low Pressure Drop Sintered Metal Filter for Ultra-High Purity Gas Systems", Proceedings of the 43rd Annual Technical Meeting of the Institute of Environmental Sciences, Los Angeles, CA, May 1997, pp. 1-10.
Rubow, et al., "Particle Penetration Characteristics of Porous Metal Filter Media For High Purity Gas Filtration," Proceedings of the 37rd Annual Technical Meeting of the Institute of Environmental Sciences, Feb. 1991, pp. 834-840.
"Test Method for Efficiency Qualification of Point-of-Use Gas Filters," Semiconductor Equipment and Materials International (SEMI) test method SEMI F38-0699.
Maire et al., Experimental Investigation of Sintered Porous Metal Filters, Journal of Aerosol Science, vol. 31, No. 6, pp. 721-738, 2000.

\* cited by examiner

COATINGS FOR ENHANCEMENT OF PROPERTIES AND PERFORMANCE OF SUBSTRATE ARTICLES AND APPARATUS

CROSS-REFERENCE TO RELATED APPLICATIONS

This application is a continuation application of U.S. patent application Ser. No. 15/550,630 which claims priority to International Application No. PCT/US2016/017910, filed Feb. 13, 2016, which in turn claims the benefit under the provisions of 35 U.S. C. § 119 of the following U.S. provisional patent applications: U.S. Provisional Patent Application No. 62/116,181 filed Feb. 13, 2015 in the names of Carlo Waldfried, et al. for "THIN FILM ATOMIC LAYER DEPOSITION COATINGS"; U.S. Provisional Patent Application No. 62/167,890 filed May 28, 2015 in the names of Bryan C. Hendrix, et al. for "COATINGS TO PREVENT TRANSPORT OF TRACE METALS BY AL2CL6 VAPOR"; U.S. Provisional Patent Application No. 62/188,333 filed Jul. 2, 2015 in the names of Bryan C. Hendrix, et al. for "COATINGS FOR ENHANCEMENT OF PROPERTIES AND PERFORMANCE OF SUBSTRATE ARTICLES AND APPARATUS"; and U.S. Provisional Patent Application No. 62/221,594 filed Sep. 21, 2015 in the names of Bryan C. Hendrix, et al. for "COATINGS FOR ENHANCEMENT OF PROPERTIES AND PERFORMANCE OF SUBSTRATE ARTICLES AND APPARATUS". The disclosures of such U.S. Provisional Patent Application Nos. 62/116,181, 62/167,890, 62/188,333, and 62/221,594 are hereby incorporated herein by reference, in their respective entireties, for all purposes.

FIELD

The present disclosure generally relates to coatings applicable to a variety of substrate articles and equipment, e.g., in respect of structures and apparatus having surface that is susceptible to formation thereon of undesired oxide, nitride, fluoride, chloride, or other halide contaminant species. In specific aspects, the disclosure relates to semiconductor manufacturing equipment and methods of enhancing the performance thereof, and more specifically relates to semiconductor manufacturing equipment susceptible to contamination and particle deposition associated with the presence of dialuminum hexachloride vapor in such equipment, and to compositions and methods for combating such adverse contamination and particle deposition.

DESCRIPTION OF THE RELATED ART

In many fields of endeavor, structures, materials, and apparatus are encountered that include surface susceptible to formation of contaminant species, such as surfaces of aluminum, anodized aluminum, quartz, stainless steel, etc. that are susceptible to formation of undesired oxide, nitride, and halide (e.g., fluoride and/or chloride) contaminant species thereon, which interfere with the use, utility, or function of the associated products, equipment, or materials.

In the field of semiconductor manufacturing, aluminum and aluminum-containing materials are widely employed. Although aluminum as a metallization material has been significantly displaced by copper in nanoscale integrated circuitry applications, aluminum nonetheless continues to be extensively utilized as a wire bonding and connection material, as well as use in thin film materials, e.g., AlN thin films as barrier layers, piezoelectric device components, cold cathode materials, etc., as well as in compound semiconductor compositions for applications such as LEDs and other optoelectronic devices or $Al_2O_3$ layers as dielectrics, dielectric dopants, barriers, optical coatings, etc.

In many of such applications, halogen gases are employed in semiconductor manufacturing equipment for processing of films in the device manufacturing operation, or as co-flow cleaning agents for removal of accumulated contaminant deposits on surfaces and components of the semiconductor manufacturing equipment. These halogen gases may include chloro species, which can reactively form dialuminum hexachloride ($Al_2Cl_6$) vapor when contacting aluminum present in the equipment, e.g., on wafers, or on surfaces or components of the equipment. Such dialuminum hexachloride vapor may in turn attack stainless steel surfaces and components in the semiconductor manufacturing equipment and serve to transport measurable levels of metals such as chromium, iron, and nickel to the wafers undergoing processing.

Another class of applications uses $Al_2Cl_6$ vapor to deposit aluminum containing films. Although $Al_2O_3$ is widely deposited by ALD using trimethyl aluminum as a source reagent, trimethyl aluminum nonetheless is a pyrophoric liquid subject to significant safety and regulatory costs. $Al_2Cl_6$ vapor can be readily produced above solid $AlCl_3$ in a solid vaporizer, such as solid vaporizer units of the type commercially sold under the trademark PoBE-Vap by Entegris, Inc., Billerica, Massachusetts, USA.

Stainless steel components of semiconductor and manufacturing equipment may be formed of 316 stainless steel or other stainless steel alloys that are generally electropolished. Such electropolishing generally leaves the surface coated with a layer of passive oxide containing chromium, iron, nickel, and other alloy components. In addition, such metal components may form surface traces of corresponding oxides by native oxidation processes. As a result, when dialuminum hexachloride encounters such metal oxides, the metal oxides react with the dialuminum hexachloride to form corresponding vapor phase metalloaluminum chloride compounds which can transport to wafers and semiconductor devices or device precursor structures and may deposit the trace metals or otherwise damage the products being manufactured in the equipment. Alternatively, the metal oxide can react with $Al_2Cl_6$ vapor to form $Al_2O_3$ and particulate metal chlorides that can transport to the device structure and cause damage. Additionally, $AlCl_3$ solid can contact the metal oxide surface to form either vapor metalloaluminum chloride or solid chloride particles.

In consequence, it would be a significant improvement to suppress the deleterious interaction of dialuminum hexachloride with metal surfaces and components in such semiconductor manufacturing equipment and other thin film deposition or etching equipment.

There is also an ongoing need for coatings for a variety of industrial applications that are dense, pinhole-free and defect-free, and provide other coating qualities and advantages, such as electrical insulation of parts, the ability to coat parts conformally, chemical and etch resistance, corrosion resistance, diffusion barrier properties, and adhesion layer properties.

SUMMARY

The present disclosure generally relates to coatings applicable to a variety of substrate articles, structures, materials, and equipment, and relates in specific aspects to semiconductor manufacturing equipment and methods of enhancing the performance thereof, and more specifically to semiconductor manufacturing equipment susceptible to contamination and particle deposition associated with the presence of dialuminum hexachloride in such equipment, and to compositions and methods for combating such adverse contamination and particle deposition.

The disclosure relates in one aspect to a structure, material, or apparatus comprising metal surface susceptible to formation of oxide, nitride, or halide of said metal thereon, the metal surface configured to be contacted in use or operation of said structure, material, or apparatus with gas, solid, or liquid that is reactive with such metal oxide, nitride, or halide, to form a reaction product that is deleterious to said structure, material, or apparatus and its use or operation, wherein the metal surface is coated with a protective coating preventing reaction of the coated surface with the reactive gas.

In one aspect, the disclosure relates to a semiconductor manufacturing apparatus comprising metal surface susceptible to formation of oxide, nitride, or halide of said metal thereon, the metal surface configured to be contacted in operation of said apparatus with gas, solid, or liquid that is reactive with said metal oxide, nitride, or halide to form a reaction product, e.g., a particulate reaction product and/or a vapor reaction product, that is deleterious to said apparatus and its operation, wherein the metal surface is coated with a protective coating preventing reaction of the coated surface with the reactive gas.

A further aspect of the disclosure relates to a method of improving performance of a structure, material, or apparatus comprising metal surface susceptible to formation of oxide, nitride, or halide of said metal thereon, wherein the metal surface is configured to be contacted in use or operation of said structure, material, or apparatus with gas, solid, or liquid that is reactive with said metal oxide, nitride, or halide to form a reaction product that is deleterious to said structure, material, or apparatus and its use or operation, said method comprising coating the metal surface with a protective coating preventing reaction of the coated surface with the reactive gas.

In another aspect, the disclosure relates to a method of improving performance of a semiconductor manufacturing apparatus comprising metal surface susceptible to formation of oxide, nitride, or halide of said metal thereon, wherein the metal surface is configured to be contacted in operation of said apparatus with gas, solid, or liquid that is reactive with the metal oxide, nitride, or halide to form a reaction product that is deleterious to said apparatus and its operation, such method comprising coating the metal surface with a protective coating preventing reaction of the coated surface with the reactive gas.

In another aspect, the disclosure relates to improving the performance of a semiconductor manufacturing apparatus in contact with a reactive solid.

In accordance with a further aspect of the disclosure, there are provided thin film atomic layer deposition coatings for industrial applications. Thin film coatings in accordance with the disclosure are described in the specification herein.

Another aspect of the disclosure relates to a composite ALD coating, comprising layers of different ALD product materials.

A further aspect of the disclosure relates to a composite coating, comprising at least one ALD layer and at least one deposited layer that is not an ALD layer.

In another aspect, the disclosure relates to a method of forming a patterned ALD coating on a substrate, comprising forming a pattern on the substrate of a layer of surface termination material that is effective to prevent ALD film growth.

In another aspect, the disclosure relates to a method of filling and/or sealing surface infirmities of a material, said method comprising applying an ALD coating on a surface infirmity of the material, at a thickness effecting filling and/or sealing of the infirmity.

A further aspect of the disclosure relates to a filter, comprising a matrix of fibers and/or particles, the fibers and/or particles being formed of metal and/or polymeric material, wherein the matrix of fibers and/or particles has an ALD coating thereon, wherein the ALD coating does not alter pore volume of the matrix of fibers and/or particles by more than 5%, as compared to a corresponding matrix of fibers and/or particles lacking said ALD coating thereon, and wherein when the fibers and/or particles are formed of metal, and the ALD coating comprises metal, the metal of the ALD coating is different from the metal of the fibers and/or particles.

Yet another aspect of the disclosure relates to a method of delivering a gaseous or vapor stream to a semiconductor processing tool, said method comprising providing a flow path for the gaseous or vapor stream, from a source of said gaseous or vapor stream to the semiconductor processing tool, and flowing the gaseous or vapor stream through a filter in the flow path to remove extraneous solid material from the stream, wherein the filter comprises a filter of the present disclosure, as variously described herein.

The disclosure in a further aspect relates to a filter comprising a sintered matrix of stainless steel fibers and/or particles that is coated with an ALD coating of alumina, wherein the sintered matrix comprises pores of a diameter in a range of from 1 to 40 µm, e.g., from 10 to 20 µm, and the ALD coating has a thickness in a range of from 2 to 500 nm.

Another aspect of the disclosure relates to a solid vaporizer apparatus comprising a vessel defining an interior volume including support surface therein for solid material to be vaporized, wherein at least a portion of the support surface has an ALD coating thereon.

The disclosure relates in a further aspect to a thin film coating comprised of one or more layers, wherein at least one layer is deposited by atomic layer deposition.

Another aspect of the disclosure relates to an ALD coating having a film thickness exceeding 1000 Å.

A further aspect of the disclosure relates to an ALD coating comprising a very dense, pinhole free, defect-free layer.

Yet another aspect of the disclosure relates to a thin film coating deposited on a part surface other than an integrated circuit device on a silicon wafer.

In a further aspect, the disclosure relates to an ALD coating comprised of insulating metal oxide and metal.

Another aspect the disclosure relates to an ALD coating that is depositable at temperature in a range of from 20° C. to 400° C.

A further aspect of the disclosure relates to an ALD coating comprising a single film having a defined stoichiometry.

Another aspect of the disclosure relates to a thin film coating comprising an ALD layer in combination with at least one other layer deposited by a different deposition technique.

In another aspect, the disclosure relates to a multilayer ALD coating, having a coating thickness not exceeding 2 µm.

Another aspect of the disclosure relates to an ALD coating of material selected from the group consisting of oxides, alumina, aluminum-oxy nitride, yttria, yttria-alumina mixes, silicon oxide, silicon oxy-nitride, transition metal oxides, transition metal oxy-nitrides, rare earth metal oxides, and rare earth metal oxy-nitrides.

A further aspect of the disclosure relates to a method of forming a patterned ALD coating on a substrate part, such method comprising: uniformly coating the part with an ALD coating; and etching back unwanted coating material through a mask.

Another method aspect of the disclosure relates to a method of forming a patterned ALD coating on a substrate part, such method comprising: masking an area of the part; coating the part with an ALD coating; and removing the ALD coating from the mask area of the part.

A still further method aspect of the disclosure relates to a method of forming a patterned ALD coating on a substrate part, such method comprising: patterning the substrate part with material comprising a surface termination component that blocks the ALD film growth; and coating the patterned substrate part with an ALD coating.

A further aspect of the disclosure relates to a method of electrically insulating a substrate part, comprising applying to said substrate part a defect-flee, pin-hole-free, dense, electrically insulating ALD coating.

The disclosure relates in another aspect to a coating on a substrate surface, comprising an ALD coating having a chemically resistant and etch-resistant character.

Another aspect of the disclosure relates to a coating on a substrate surface, comprising an ALD corrosion-resistant coating.

A further aspect of the disclosure relates to a coating on a substrate surface, comprising an ALD diffusion barrier layer.

A still further aspect of the disclosure relates to a coating on a substrate surface, comprising an ALD adhesion layer.

Yet another aspect of the disclosure relates to a coating on a substrate surface, comprising an ALD surface sealant layer.

In another aspect, the disclosure relates to a porous filter comprising a fibrous metal membrane coated with a chemically resistant ALD coating.

A further aspect of the disclosure relates to a filter comprising a porous material matrix coated with an ALD coating wherein the average pore size of the porous metal matrix has been reduced by the ALD coating, in relation to a corresponding porous material matrix not coated with the ALD coating.

Another aspect of the disclosure relates to a filter comprising a porous material matrix coated with an ALD coating, wherein the coating thickness is directionally varied to provide a corresponding pore size gradient in the filter.

In a further aspect, the disclosure relates to a method of fabricating a porous filter, comprising coating a porous material matrix with an ALD coating, to reduce average pore size of the porous material matrix.

In another aspect, the disclosure relates to a solid vaporizer apparatus comprising a container defining therein an interior volume, an outlet configured to discharge precursor vapor from the container, and support structure in the interior volume of the container adapted to support solid precursor material thereon for volatilization thereof to form the precursor vapor, wherein the solid precursor material comprises aluminum precursor, and wherein at least part of surface area in the interior volume is coated with an alumina coating.

A further aspect the disclosure relates to a method of enhancing corrosion resistance of a stainless steel structure, material, or apparatus that in use or operation is exposed to aluminum halide, said method comprising coating said stainless steel structure, material, or apparatus with an alumina coating.

Another aspect of the disclosure relates to a semiconductor processing etching structure, component, or apparatus that in use or operation is exposed to etching media, said structure, component, or apparatus being coated with a coating comprising a layer of yttria, wherein the layer of yttria optionally overlies a layer of alumina in said coating.

Yet another aspect of the disclosure relates to a method of enhancing corrosion resistance and etch resistance of a semiconductor processing etching structure, component, or apparatus that in use or operation is exposed to etching media, said method comprising coating the structure, component, or apparatus with a coating comprising a layer of yttria, wherein the layer of yttria optionally overlies a layer of alumina in said coating.

Another aspect, the disclosure relates to a etch chamber diffuser plate comprising a nickel membrane encapsulated with an alumina coating.

A further aspect of the disclosure relates to a method of enhancing corrosion resistance and etch resistance to an etch chamber diffuser plate comprising a nickel membrane, comprising coating the nickel membrane with an encapsulating coating of alumina.

In another aspect, the disclosure relates to a vapor deposition processing structure, component, or apparatus that in use or operation is exposed to halide media, said structure, component, or apparatus being coated with a coating of yttria comprising an ALD base coating of yttria, and a PVD over coating of yttria.

In still another aspect, the disclosure relates to a method of enhancing corrosion resistance and etch resistance of a vapor deposition processing structure, component, or apparatus that in use or operation is exposed to halide media, said method comprising coating the structure, component, or apparatus with a coating of yttria comprising an ALD base coating of yttria, and a PVD over coating of yttria.

Yet another aspect of the disclosure relates to a quartz envelope structure coated on an interior surface thereof with an alumina diffusion barrier layer.

A further aspect of the disclosure relates to a method of reducing diffusion of mercury into a quartz envelope structure susceptible to such diffusion in operation thereof said method comprising coating an interior surface of the quartz envelope structure with an alumina diffusion barrier layer.

A still further aspect of the disclosure relates to a plasma source structure, component, or apparatus that in use or operation is exposed to plasma and voltage exceeding 1000 V, wherein plasma-wetted surface of said structure, component or apparatus is coated with an ALD coating of alumina, and said alumina coating is overcoated with a PVD coating of aluminum oxynitride.

The disclosure in one aspect relates to a method of enhancing service life of a plasma source structure, component, or apparatus that in use or operation is exposed to plasma and voltage exceeding 1000 V, said method comprising coating plasma-wetted surface of said structure, component or apparatus with an ALD coating of alumina, and over coating said alumina coating with a PVD coating of aluminum oxynitride.

The disclosure in another aspect relates to a dielectric stack, comprising sequential layers including a base layer of alumina, a nickel electrode layer thereon, an ALD alumina electrical stand-off layer on the nickel electrode layer, a PVD aluminum oxynitride thermal expansion buffer layer on the ALD alumina electrical stand-off layer, and a CVD silicon oxynitride wafer contact surface and electrical spacer layer on the PVD aluminum oxynitride thermal expansion buffer layer.

The disclosure in another aspect relates to a plasma activation structure, component, or apparatus, comprising aluminum surface coated with one of the multilayer coatings of (i) and (ii): (i) a base coat of CVD silicon on the aluminum surface, and a layer of ALD zirconia on the base coat of CVD silicon; and (ii) a base coat of CVD silicon oxynitride on the aluminum surface, and a layer of ALD alumina on the base coat of CVD silicon oxynitride.

Another aspect of the disclosure relates to a method of reducing particle formation and metal contamination for an aluminum surface of a plasma activation structure, component, or apparatus, said method comprising coating the aluminum surface with one of the multilayer coatings of (i) and (ii): (i) a base coat of CVD silicon on the aluminum surface, and a layer of ALD zirconia on the base coat of CVD silicon; and (ii) a base coat of CVD silicon oxynitride on the aluminum surface, and a layer of ALD alumina on the base coat of CVD silicon oxynitride.

A porous matrix filter is contemplated in another aspect of the disclosure, the porous matrix filter comprising a membrane formed of stainless steel, nickel, or titanium, wherein the membrane is encapsulated with alumina to a coating penetration depth in a range of from 20 to 2000 μm.

In a corresponding method aspect, the disclosure relates to a method of making a porous matrix filter comprising encapsulating a membrane formed of stainless steel, nickel, or titanium with alumina to a coating penetration depth in a range of from 20 to 2000 μm.

Other aspects, features and embodiments of the disclosure will be more fully apparent from the ensuing description and appended claims.

BRIEF DESCRIPTION OF THE DRAWINGS

FIG. 30 is a photomicrograph of a coated filter, wherein the coating is alumina, having a coating penetration depth of 35 μm.

FIG. 31 is a photomicrograph of a coated filter, wherein the coating is alumina, having a coating penetration depth of 175 μm

DETAILED DESCRIPTION

Figure 1:
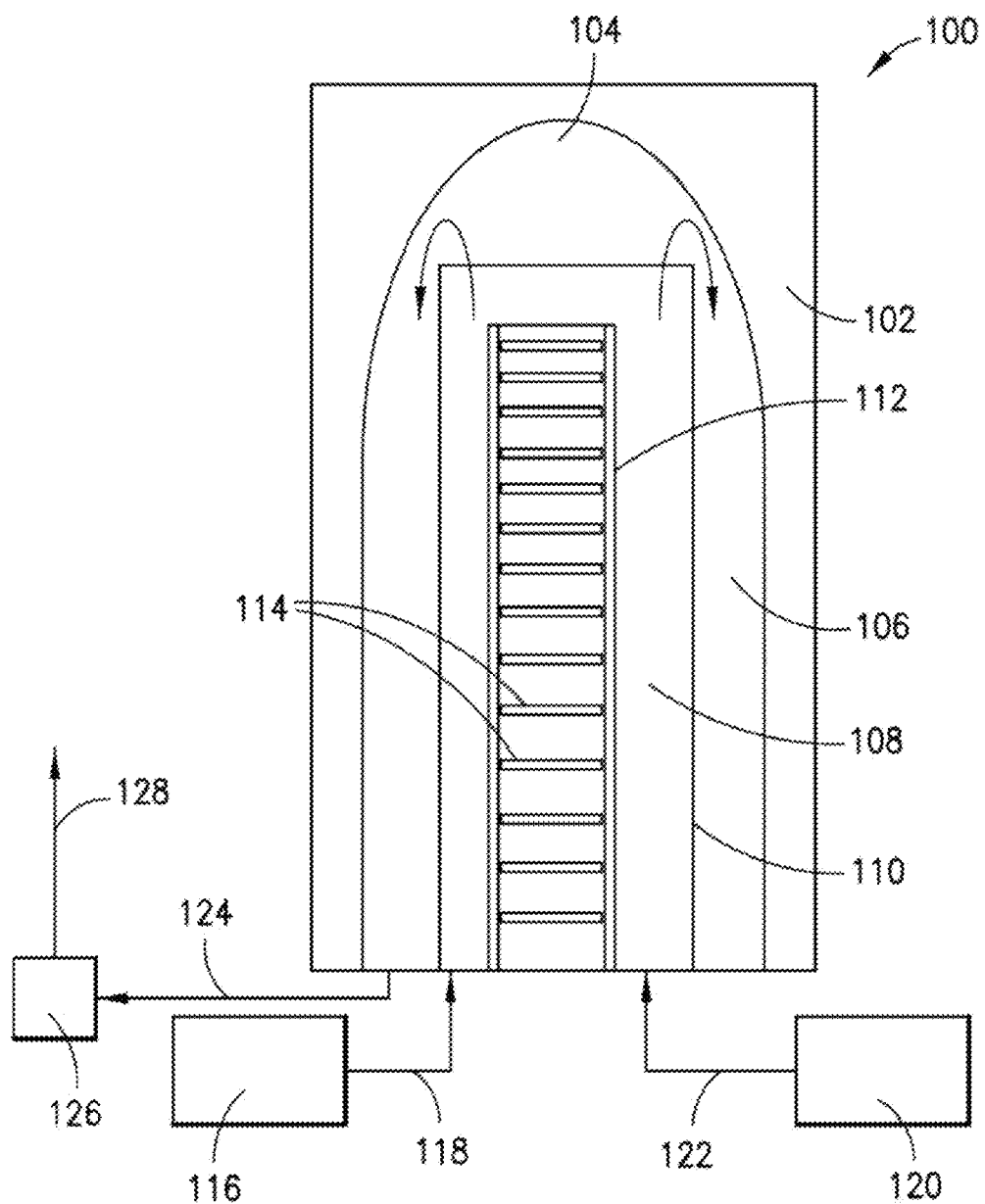
FIG. 1 is a schematic representation of a deposition furnace of a semiconductor wafer processing tool according to one aspect of the present disclosure.

The present disclosure generally relates to coatings applicable to a variety of substrate articles, materials, structures, and equipment. In various aspects, the disclosure relates to semiconductor manufacturing equipment and methods of enhancing the performance thereof, and more specifically to semiconductor manufacturing equipment susceptible to contamination and particle deposition associated with the presence of dialuminum hexachloride in such equipment, and to compositions and methods for combating such adverse contamination and particle deposition.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_2$ alkyl, or any other sub-range within the broad carbon number range. In other words, a carbon number range is deemed to affirmatively set forth each of the carbon number species in the range, as to the substituent, moiety, or compound to which such range applies, as a selection group from which specific ones of the members of the selection group may be selected, either as a sequential carbon number sub-range, or as specific carbon number species within such selection group.

The same construction and selection flexibility is applicable to stoichiometric coefficients and numerical values specifying the number of atoms, functional groups, ions or moieties, as to specified ranges, numerical value constraints (e.g., inequalities, greater than, less than constraints), as well as oxidation states and other variables determinative of the specific form, charge state, and composition applicable to dopant sources, implantation species, and chemical entities within the broad scope of the present disclosure.

"Alkyls" as used herein include, but are not limited to, methyl, ethyl, propyl, isopropyl, butyl, s-butyl, t-butyl, pentyl and isopentyl and the like. "Aryls" as used herein includes hydrocarbons derived from benzene or a benzene derivative that are unsaturated aromatic carbocyclic groups of from 6 to 10 carbon atoms. The aryls may have a single or multiple rings. The term "aryl" as used herein also includes substituted aryls. Examples include, but are not limited to phenyl, naphthyl, xylene, phenylethane, substituted phenyl, substituted naphthyl, substituted xylene, substituted phenylethane and the like. "Cycloalkyls" as used herein include, but are not limited to cyclopropyl, cyclobutyl, cyclopentyl, cyclohexyl and the like. In all chemical formulae herein, a range of carbon numbers will be regarded as specifying a sequence of consecutive alternative carbon-containing moieties, including all moieties containing numbers of carbon atoms intermediate the endpoint values of carbon number in the specific range as well as moieties containing numbers of carbon atoms equal to an endpoint value of the specific range, e.g., $C_1$-$C_6$, is inclusive of $C_1$, $C_2$, $C_3$, $C_4$, $C_5$ and $C_6$, and each of such broader ranges may be further limitingly specified with reference to carbon numbers within such ranges, as sub-ranges thereof. Thus, for example, the range $C_1$-$C_6$ would be inclusive of and can be further limited by specification of sub-ranges such as $C_1$-$C_3$, $C_1$-$C_4$, $C_2$-$C_6$, $C_4$-$C_6$, etc. within the scope of the broader range.

The disclosure relates in one aspect to a structure, material, or apparatus comprising metal surface susceptible to formation of oxide, nitride, or halide (fluoride, chloride, iodide, and/or bromide) of such metal thereon, the metal surface configured to be contacted in use or operation of such structure, material, or apparatus with gas, solid, or liquid that is reactive with said metal oxide, nitride, or halide to form a reaction product that is deleterious to the structure, material, or apparatus and its use or operation, wherein the metal surface is coated with a protective coating preventing reaction of the coated surface with the reactive gas.

In one aspect, the disclosure relates to a semiconductor manufacturing apparatus comprising metal surface susceptible to formation of oxide, nitride, or halide of said metal thereon, the metal surface configured to be contacted in use or operation of said apparatus with gas, solid, or liquid that is reactive with said metal to form a reaction product that is deleterious to said apparatus and its use or operation, wherein the metal surface is coated with a protective coating preventing reaction of the coated surface with the reactive gas.

In such semiconductor manufacturing apparatus, the metal oxide may in various embodiments comprise at least one oxide of one or more of Cr, Fe, Co, and Ni, or in other embodiments the metal oxide may comprise at least one oxide of one or more of Cr, Fe, and Ni. Metal nitrides may for example form from iron or cobalt in the presence of ammonia during processing when ammonia is present, with the resulting iron nitride or cobalt nitride subsequently reacting with $AlCl_3$ or $TiCl_4$. Metal halides may form on the metal surface during and etch operation or a cleaning cycle operation. The metal surface in various embodiments may comprise stainless steel surface. In specific embodiments, the gas that is reactive with the metal oxide, nitride, or halide to form a reaction product that is deleterious to the apparatus and its use or operation, comprises $Al_1Cl_6$.

The protective coating in specific applications may comprise one or more of coating materials selected from the group consisting of $Al_2O_3$, oxides of the formula MO, wherein M is Ca, Mg, or Be; oxides of the formula $M'O_2$, wherein M' is a stoichiometrically acceptable metal; and oxides of the formula $Ln_2O_3$, wherein Ln is a lanthanide element, e.g., La, Sc, or Y. More generally, the protective coating may comprise a metal oxide for which the free energy of reaction with the material that is contacted with the metal surface in the operation of the apparatus, is greater than or equal to zero.

A further aspect of the disclosure relates to a method of improving performance of a structure, material, or apparatus comprising metal surface susceptible to formation of oxide, nitride, or halide of such metal thereon, wherein the metal surface is configured to be contacted in use or operation of said structure, material, or apparatus with gas, solid, or liquid that is reactive with said metal oxide, nitride, or halide to form a reaction product that is deleterious to said structure, material, or apparatus and its use or operation, such method comprising coating the metal surface with a protective coating preventing reaction of the coated surface with the reactive gas.

In another aspect, the disclosure relates to a method of improving performance of a semiconductor manufacturing apparatus comprising metal surface susceptible to formation of oxide, nitride, or halide of said metal thereon, wherein the metal surface is configured to be contacted in use or operation of said apparatus with gas that is reactive with such metal oxide, nitride, or halide to form a reaction product that is deleterious to said apparatus and its use or operation, such method comprising coating the metal surface with a protective coating preventing reaction of the coated surface with the reactive gas.

The metal oxide, nitride, or halide in various embodiments may comprise at least one oxide, nitride, or halide of one or more of Cr, Fe, Co, and Ni, and may comprise in other embodiments at least one oxide, nitride, or halide of one or more of Cr, Fe, and Ni, or any other suitable metal oxide, nitride, or halide species. The metal surface may for example comprise stainless steel. The gas that is reactive with the metal oxide, nitride, or halide to form a reaction product that is deleterious to the structure, material, or apparatus and its use or operation, may comprise $Al_2Cl_6$.

The protective coating that is applied to the metal surface in the aforementioned method may comprise one or more of coating materials selected from the group consisting of $Al_2O_3$, oxides of the formula MO, wherein M is Ca, Mg, or Be; oxides of the formula $M'O_2$, wherein M' is a stoichiometrically acceptable metal; and oxides of the formula $Ln_2O_3$, wherein La is a lanthanide element, e.g., La, Sc, or Y. More generally, the protective coating may comprise a metal oxide for which the free energy of reaction with the gas that is contacted with the metal surface in the use or operation of said structure, material, or apparatus, is greater than or equal to zero.

The protective coating may be applied to the metal surface in the method of the present disclosure by any suitable technique, and in specific applications, the coating operation may comprise physical vapor deposition (PVD), chemical vapor deposition (CVD), solution deposition, or atomic layer deposition (ALD) of the protective coating.

ALD is a preferred technique for application of the protective coating to the metal surface. In specific applications, plasma-enhanced ALD may be utilized as the ALD process for forming the protective coating on the metal surface. In various ALD embodiments, the protective coating may comprise $Al_2O_3$. Such protective coating may for example be applied by atomic layer deposition comprising a process sequence in which trimethylaluminum and ozone are utilized in a cyclic ALD process to form the protective coating, or alternatively, by atomic layer deposition comprising a process sequence in which trimethylaluminum and water are utilized in a cyclic ALD process to form the protective coating.

In other ALD implementations of the method, the protective coating may comprise a metal oxide of the formula MO, wherein M is Ca, Mg, or Be. For its application, the atomic layer deposition may comprise a process sequence in which a cyclopentadienyl M compound and ozone are utilized in a cyclic ALD process to form the protective coating, or a process sequence in which a cyclopentadienyl M compound and water are utilized in a cyclic ALD process to form the protective coating, or a process sequence in which an M beta-diketonate compound and ozone are utilized in a cyclic ALD process to form the protective coating, or other suitable process sequence and metal oxide precursor compound. A wide variety of precursor ligands may be employed for deposition of the protective coating, including, without limitation, H, $C_1$-$C_{10}$ alkyl, linear, branched, or cyclic, saturated or unsaturated; aromatic, heterocyclic, alkoxy, cycloalkyl, silyl, silylalkyl, silylamide, trimethylsilyl silyl-substituted alkyl, trialkylsilyl-substituted alkynes, and trialkylsilylamido-substituted alkynes, dialkylamide, ethylene, acetylene, alkynes, substituted alkenes, substituted alkynes, diene, cyclopentadienyls alienes, amines, alkyl amines or bidentate amines, ammonia, $RNH_2$ (wherein R is an organo, e.g., hydrocarbyl, substituent), amidinates, guanidinates, diazadiene cyclopentadienyls, oximes, hydroxyamines, acetates, beta-diketonates, beta-ketoiminates, nitriles, nitrates, sulfates, phosphates, halo; hydroxyl, substituted hydroxyl, and combinations and derivatives thereof.

In still other ALD implementations of the method of applying the protective coating to the metal surface, the protective coating may comprise a metal oxide of the formula $Ln_2O_3$, wherein Ln is a lanthanide element. Ln may for example be La, Sc, or Y. In applying the lanthanide oxide protective coating, the atomic layer deposition may comprise a process sequence in which a cyclopentadienyl Ln compound and ozone are utilized in a cyclic ALD process to form the protective coating, or a process sequence in which a cyclopentadienyl Ln compound and water are utilized in a cyclic ALD process to form the protective coating, or a process sequence in which an La beta-diketonate compound and ozone are utilized in a cyclic ALD process to form the protective coating, or other suitable process sequence and lanthanide precursor compound.

The protective coating may be coated on the metal surface at any suitable thickness, e.g., a coating thickness in a range of from 5 nm to 5 µm.

In various embodiments, the metal surface may be at temperature in a range of from 25° C. to 400° C. during coating of the metal surface with the protective coating. In other embodiments, such metal surface may be at temperature in a range of from 150° C. to 350° C. during the coating operation. In still other embodiments, the temperature of the metal surface may be in other ranges, for application of protective coating thereto.

The problem addressed by the present disclosure of chemical attack and transport of contaminant species in semiconductor manufacturing operations, is particularly acute in stainless steel furnaces in which wafers are processed for manufacture of microelectronic devices and other semiconductor manufacturing products. In such furnaces, the flow of dialuminum hexachloride vapor has been found to transport measurable levels of Cr, Fe, and Ni to wafers when $Al_2Cl_6$ vapor is moved through the system. Current levels measured are consistent with the removal of corresponding oxides of such metals that are left on the surface of the stainless steel, e.g., 316L stainless steel, by either native oxidation or by electro-polishing.

The present disclosure addresses this problem by coating surfaces and components of the furnace with a coating of a material that will not react with $Al_2Cl_6$. This achieves a solution that is far preferable to approaches for removing surface oxides, nitrides, and halides from stainless steel surfaces and components so that they do not react with $Al_2Cl_6$, since there will always be low levels of ambient moisture leakage or maintenance events that will expose such surfaces and components to moisture and oxygen, nitrogen, and halogens. Further, if $Al_2Cl_6$ were to be flowed in large volumes through the furnace to reactively remove the metal oxides, nitrides, and halides, such approach would severely degrade tool throughput and is not a viable solution.

The present disclosure contrariwise employs a coating of the surfaces and components in the furnace or other semiconductor manufacturing equipment, so that the surfaces and components are passivated and do not react with the $Al_2Cl_6$. As discussed, the coating advantageously comprises one or more of coating materials selected from the group consisting of $Al_2O_3$, oxides of the formula MO, wherein M is Ca, Mg, or Be; oxides of the formula $M'O_2$, wherein M' is a stoichiometrically acceptable metal, and oxides of the formula $Ln_2O_3$, wherein Ln is a lanthanide element, e.g., La, Sc, or Y.

The coating can be applied in any suitable manner that produces a continuous conformal coating on the surfaces and components of the semiconductor manufacturing equipment, including techniques of physical vapor deposition (PVD), chemical vapor deposition (CVD), solution deposition, and atomic layer deposition (ALD).

ALD deposition is particularly advantageous for coating filter elements and the inside of tubes. Trimethylaluminum/ozone ($TMA/O_3$) or trimethylaluminum/water ($TMA/H_2O$) is useful compositions for depositing $Al_2O_3$. Cyclopentadienyl compounds of the metal M or of Ln can be utilized to deposit MO or $Ln_2O_3$ in cyclic ALD processes utilizing ozone ($O_3$) or water vapor ($H_2O$). Beta-diketonates of M or Ln can be utilized to deposit MO or $Ln_2O_3$ in a cyclic ALD process in which reactive pulses of the beta-diketonate metal precursor alternate with pulses of $O_3$.

For deposition of an aluminum oxide protective coating, a precursor for the metal, e.g., trimethylaluminum is selected together with an oxic component, such as ozone or water, and the coating conditions are identified, which may illustratively comprise an ALD sequence of $TMA/purge/H_2O/purge$ or a sequence of $TMA/purge/O_3/purge$, with a substrate temperature that may for example be in a range of from 150° C. to 350° C., and a coating thickness in a range of from 5 nm to 5 µm. The pulse and purge times for the process sequence can then be determined for a particular reactor and the geometry of the surface or component that is being coated.

As a general approach, suitable metal oxides for protecting surfaces from dialuminum hexachloride, and suitable metal oxides for protection of surfaces from metal halide vapor can be selected based on the following methodology.

The temperature at which dialuminum hexachloride exposure will occur in the semiconductor equipment is first specified, and then the chemical reactions are identified for the metals of the surfaces and components of the semiconductor manufacturing equipment with the chemical reagents that will be contacting such surfaces and components. For these chemical reactions at the specified temperature, the enthalpy and entropy changes, as well as the free energy and reaction constant, can be identified, as shown for example in Table 1 below.

TABLE 1

| | T | ΔH (kJ) | ΔS (J/K) | ΔG (kJ) | K |
|---|---|---|---|---|---|
| $2\ Cr_{(s)} + Al2Cl6_{(g)} \rightarrow 2\ CrCl3_{(s)} + Al_{(s)}$ | 120° C. | 185 | −207 | 267 | 10 − 36 |
| $Cr_2O_{3(s)} + Al_2Cl_{6(g)} \rightarrow 2\ CrCl_{3(s)} + Al_2O_{3(s)}$ | 120° C. | −354 | −256 | −253 | 10 + 33 |
| $Al_2O_{3(s)} + Al_2Cl_{6(g)} \rightarrow 2AlCl_{3(s)} + Al_2O_{3(s)}$ | | | | | |
| $3CaO_{(s)} + Al_2Cl_{6(g)} \rightarrow 3CaCl_{2(s)} + Al_2O_{3(s)}$ | 100° C. | −860 | −206 | −784 | 5.0E+109 |
| $3MgO_{(s)} + Al_2Cl_{6(g)} \rightarrow 3MgCl_{2(s)} + Al_2O_{3(s)}$ | 100° C. | −497 | −226 | −413 | 6.5E+57 |
| $3BeO_{(s)} + Al_2Cl_{6(g)} \rightarrow 3BeCl_{2(s)} + Al_2O_{3(s)}$ | 100° C. | −38.0 | −226 | 46.4 | 3.2E−7 |
| $La_2O_{3(s)} + Al_2Cl_{6(g)} \rightarrow 2LaCl_{3(s)} + Al_2O_{3(s)}$ | 100° C. | −727 | −269 | −627 | 5.4E+87 |
| $Sc_2O_{3(s)} + Al_2Cl_{6(g)} \rightarrow 2ScCl_{3(s)} + Al_2O_{3(s)}$ | 100° C. | −320 | −239 | −231 | 2.4E+32 |
| $Y_2O_{3(s)} + Al_2Cl_{6(g)} \rightarrow 2YCl_{3(s)} + Al_2O_{3(s)}$ | 100° C. | −474 | −243 | −384 | 4.9E+53 |
| $2TiN_{(s)} + Al2Cl6(g) \rightarrow 2TiCl_{3(s)} + 2AlN_{(s)}$ | 100° C. | −106 | −207 | −29 | 1.2E+4 |
| $2Au(s) + Al2Cl6(g) = 2AuCl3(s) + 2Al(s)$ | 100° C. | 1062 | −170 | 1125 | 2.5E−158 |
| $6Ag(s) + Al2Cl6(g) = 6AgCl(s) + 2Al(s)$ | 100° C. | 537 | −80 | 567 | 3.7E−80 |
| $Al2O3(s) + 6HBr(g) = 2AlBr3(g) + 3H2O(g)$ | 100° C. | 346 | 21 | 229 | 3.7E−87 |
| $Al2O3(s) + 6HCl(g) = Al2Cl6(g) + 3H2O(g)$ | 100° C. | 208 | −135 | 259 | 5.8E−37 |
| $2Ni(s) + SiCl4(l) = 2NiCl2(s) + Si(s)$ | 100° C. | 74 | −92 | 108 | 6.6E−16 |
| $Ni(s) + GeF4(g) = NiF2(s) + GeF2(s)$ | 100° C. | −124 | −169 | −61 | 3.2E+8 |
| $Al2O3(s) + 1.5GeF4(g) = 2AlF3(s) + 1.5GeO2(s)$ | 100° C. | −428 | −305 | −314 | 8.6E+43 |
| $Cr2O3(s) + 1.5GeF4(g) = 2CrF3(s) + 1.5GeO2(s)$ | 100° C. | −265 | −287 | −158 | 1.3E22 |

TABLE 1-continued

| | T | ΔH (kJ) | ΔS (J/K) | ΔG (kJ) | K |
|---|---|---|---|---|---|
| Au(s) + 1.5GeF4(g) = AuF3(s) + 1.5GeF2(s) | 100° C. | 452 | −250 | 546 | 3.2E−77 |
| Cu(s) + GeF4(g) = CuF2(s) + GeF2(s) | 100° C. | −9 | −1667 | 55 | 3.3E−8 |
| Au(s) + 2HF(g) = AuF2(s) + H2(g) | 100° C. | 310 | −155 | 368 | 3.5E−52 |
| A $MO_{x/2(s)}$ + $Al_2Cl6_{(g)}$ -> A $MCl_{x(s)}$ + $Al_2O_{3(s)}$ | 120° C. | | | ≥0 | |
| A $MO_{x/2(s)}$ + $NX_{y(g)}$ -> A $MX_{x(s)}$ + $NO_{2y(s)}$ | 120° C. | | | ≥0 | | wherein A is the number of moles, X is a halide, and N is an arbitrary metal. For example, $NX_y$ could be $HfCl_4$ or $WCl_6$.

The reaction in the first line of Table 1 will not cause corrosion of the metal in the semiconductor manufacturing equipment, because the free energy of the reaction is positive. The reaction in the second line of Table 1, however, can cause corrosion. By changing the surface oxide of the stainless steel semiconductor manufacturing equipment from $Cr_2O_3$ to $Al_2O_3$, the driving force for the reaction goes to zero. Alternatively, as shown in the third line of Table 1, the protective oxide can be chosen from any metal oxide $MO_x$ for which the free energy of the reaction is greater than or equal to zero (and in which x has any stoichiometrically appropriate value). Further, as shown in the fourth line of Table 1, if a general metal halide vapor $NX_y$ is being delivered, such as $NF_3$, a protective oxide can be chosen from metal oxides $MO_x$ for which the free energy of the reaction is greater than or equal to zero.

The protective coatings of the present disclosure may be utilized to protect against corrosive agents such as $NF_3$, $Al_2Cl_6$, $HfCl_4$, $TiCl_4$, $ZrCl_4$, $WCl_6$, $WCl_5$, $VCl_4$, $NbCl_5$, $TaCl_5$, and other metal chlorides. For example, $Al_2O_3$ may be utilized as a protective coating material for these corrosive agents. Semiconductor materials that may be delivered as gases or vapors, such as fluorine, chlorine, bromine, hydrogen fluoride, hydrogen chloride, hydrogen bromide, xenon difluoride, boron trifluoride, silicon tetrafluoride, germanium tetrafluoride, phosphorus trifluoride, arsenic trifluoride, boron trichloride, silicon tetrachloride, ozone, may mediate corrosive behavior, and $Al_2O_3$ coatings may be usefully employed to provide a protective film against such corrosive agents. Titanium tetrachloride is quite corrosive and would have a positive ΔG for $Y_2O_3$.

In specific embodiments, $Al_2O_2$ is utilized as a protective coating material having a positive ΔG for hydrogen bromide exposure of stainless steel surfaces. In other embodiments, $Al_2O_3$ is utilized as a protective coating material having a positive ΔG for hydrogen chloride exposure of stainless steel surfaces. In still other embodiments, nickel is utilized as a protective coating material having a positive ΔG for silicon tetrachloride exposure of stainless steel surfaces.

In additional embodiments, protective coatings having a positive ΔG on stainless steel surfaces in exposure to germanium tetrafluoride may comprise any of nickel, $Al_2O_3$, $Cr_2O_3$, gold, nitrides such as titanium nitride (TiN), glasses, and copper. Passivation with germanium tetrafluoride is effective for stainless steel and nickel due to the formation of surface Ni—F, Cr—F, and Fe—F species, which can be considered as $NiF_2$, $CrF_3$, or $FeF_3$ layers overlying nickel or stainless steel.

In other embodiments, gold is utilized as a protective coating material having a positive ΔG for hydrogen fluoride exposure of stainless steel surfaces.

In various embodiments, protective coatings for stainless steel and carbon steel include metals such as nickel and metal alloys. In other embodiments, protective coatings for such services may include polymeric materials, such as polytetrafluoroethylene (PTFE) or PTFE-like materials, including protective coatings of materials commercially available under the trademarks Teflon® and Kalrez®. Protective coatings may also be employed to avoid embrittlement of stainless steel caused by exposure to hydride gases, and such protective coatings may be formed of or otherwise comprise materials such as aluminum, copper, or gold.

The reactive agents for which protective coatings are provided on the surfaces may be of solid, liquid and/or gas form, and may be in a mixture or a solution including one or more solvents.

Concerning ΔG more generally, stability in a range of $10^{-4}<K<10^{+4}$ can be switched by pressure or temperature changes, and when $K>10^{+4}$ there will be little corrosion under any conditions.

The dense, pin-hole free coatings of the present disclosure, as formed by ALD or other vapor phase deposition techniques, are distinguishable from native oxide surfaces. Native oxide films typically form at or near room temperature, are crystalline, and the oxidation associated with such native oxide films may be incomplete. Such native oxide films are more reactive than the vapor phase deposition coatings, e.g., ALD coatings, of the present disclosure. The dense, thick, pin-hole free vapor phase deposition coatings of the present disclosure are amorphous and conformal.

In the case of alumina coatings on stainless steel, as formed in accordance with the present disclosure, cleaning or other pre-treatment steps may be employed before the deposition of the $Al_2O_3$ coating. For example, electropolishing or decreasing treatments may be employed, or a combination of such treatments, as may be desirable or advantageous in a specific implementation of the disclosure. Any other suitable cleaning or pre-treatment steps may additionally, or alternatively, be utilized.

In respect of aluminum trichloride, it is noted that $AlCl_3$ does not dissolve in solvents, or in oil or grease, however, oil or grease may be present as a heat transfer agent, e.g., in a solid delivery vaporizer in which $AlCl_3$ or other chemical is provided for volatilization when the vaporizer is heated, to provide a vapor stream that is dispensed from the vessel. For example, the $AlCl_3$ or other chemical to be delivered may be mixed with a high boiling point, inert oil or grease to form a paste that then is loaded onto trays or other support surface in the solid delivery vessel. The oil or grease then serves as a heat transfer agent, and as a medium to capture small particles and prevent them from being entrained in the vapor flow. These captured small particles then are retained in the oil or grease until they are vaporized and thereby pass out of the heat transfer agent and ultimately from the vaporizer vessel. In such manner, the oil or grease may improve heat conductivity and enable lower delivery temperature of the vaporizer to be achieved.

Referring now to the drawings, FIG. 1 is a schematic representation of a deposition furnace 102 of a semiconductor wafer processing tool 100 according to one aspect of the present disclosure.

The furnace 102 defines a heated interior volume 104 in which is disposed a liner 110 separating the interior volume into an inner volume 108 within the liner 110, and an exterior volume 106 outside the liner, as shown. A wafer carrier 112 having wafers 114 mounted therein is positioned in the inner volume 108 within the liner 110 so that the wafers may be contacted with process gas in the furnace.

As shown in the FIG. 1 drawing, a first process gas may be supplied to the inner volume 108 of the furnace from first process gas source 116 via first process gas feed line 118. In like manner, a second process gas may be supplied to the inner volume 108 of the furnace from second process gas source 120 via second process gas feed line 122. The first and second process gases may be concurrently or consecutively introduced to the furnace in the operation of the tool. The first process gas may for example comprise an organometallic precursor for vapor deposition of the metal component on a wafer substrate in the wafer carrier 112. The second process gas may for example comprise a halide cleaning gas. The gas introduced to the inner volume 108 of the furnace flows upwardly within the liner and upon flowing out of the upper open end of the liner 110, flows downwardly in the annular exterior volume 106. Such gas then flows out of the furnace in discharge line 124 to the abatement unit 126 in which the effluent gas from the furnace is treated to remove hazardous components therefrom, with discharge of treated gas in vent line 128 to further treatment or other disposition. The abatement unit 126 may comprise wet and/or dry scrubbers, catalytic oxidation apparatus, or other suitable abatement equipment.

In accordance with the present disclosure, the surfaces of the furnace and liner component are coated with a layer of $Al_2O_3$ so that they resist chemical attack from dialuminum hexachloride that could in turn render the wafers 114 in the furnace deficient or even useless for their intended purpose.

Figure 2:
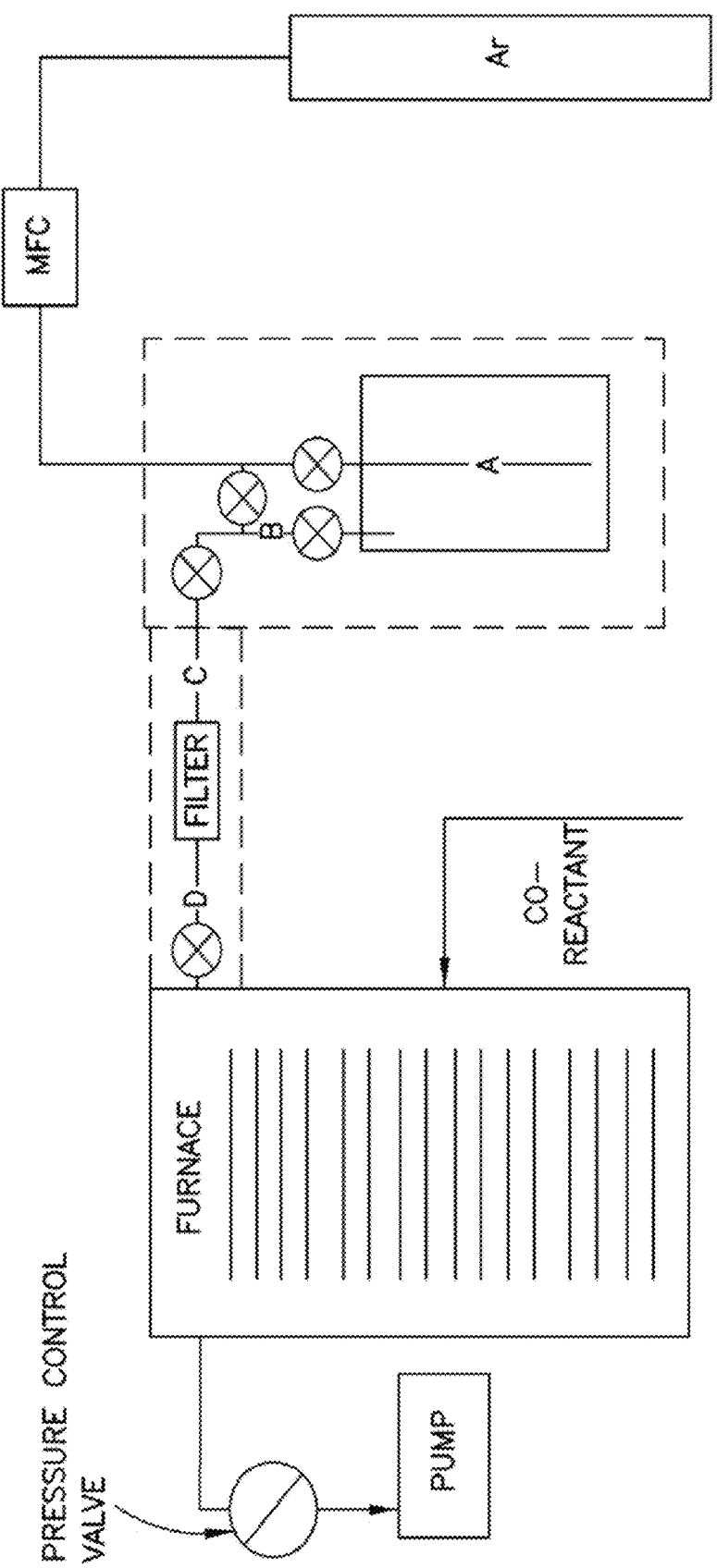
FIG. 2 is a schematic representation of a deposition furnace process system according to another aspect of the disclosure, for coating wafers using $Al_2Cl_6$ vapor, utilizing a solid source delivery vaporizer in the form of an ampoule for vaporizing $AlCl_3$ to form the $Al_2Cl_6$ vapor, wherein the trays and internal surfaces of the ampoule are coated with $Al_2O_3$, as well as all of the valves, tubing and filters downstream of the ampoule being coated with $Al_2O_3$.

FIG. 2 is a schematic representation of a deposition furnace process system according to another aspect of the disclosure, for coating wafers using $Al_2Cl_6$ vapor, utilizing a solid source delivery vaporizer in the form of an ampoule for vaporizing $AlCl_3$ to form the $Al_2Cl_6$ vapor, wherein the trays and internal surfaces of the ampoule are coated with $Al_2O_3$, as well as all of the valves, tubing and filters downstream of the ampoule being coated with $Al_2O_3$.

As illustrated, the ampoule is provided with a supply of argon carrier gas from a supply vessel ("Ar"), and the carrier gas is flowed through the carrier gas feed line containing a mass flow controller ("MFC") to the ampoule. In the ampoule, the carrier gas is contacted with the $Al_2Cl_6$ vapor produced by heating the ampoule to volatilize the solid $AlCl_3$ supported on trays therein, and the volatilized $Al_2Cl_6$ then is flowed to the furnace, containing wafers on which aluminum is deposited from the $Al_2Cl_6$ vapor. Co-reactant for the deposition may be introduced to the furnace as shown, by the co-reactant feed line to the furnace. The fluid flow through the furnace is controlled by the pump and pressure control valve assembly, to maintain conditions in the furnace appropriate for the deposition operation therein.

As mentioned, the trays and internal surfaces of the ampoule are coated with $Al_2O_3$, as are all of the flow circuitry surfaces and components therein downstream from the ampoule to prevent attack by the dialuminum hexachloride vapor. The filters in the flow circuitry may be of a type commercially available under the trademarks Wafergard™ and Gasketgard™ from Entegris, Inc., Billerica, MA, USA with metal filter elements.

Figure 3:
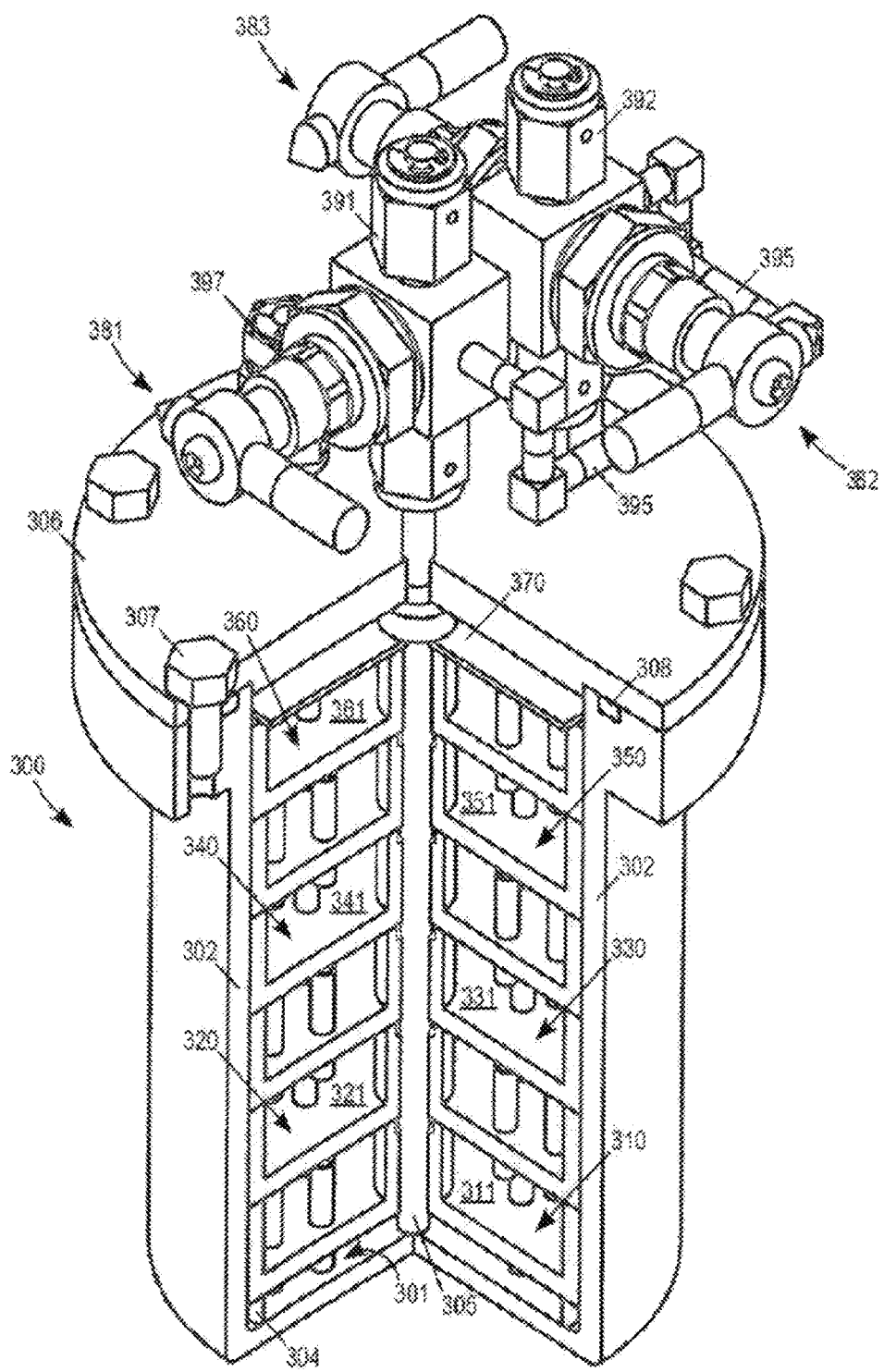
FIG. 3 is a perspective, partial breakaway view of a vaporizer container having holders to help promote contact of a gas with vapor from material supported by the holders.

FIG. 3 is a perspective, partial breakaway view of a vaporizer ampoule of a type suitable for use in the deposition furnace process system of FIG. 2. The vaporizer ampoule includes a container 300 having holders to help promote contact of a gas with vapor from material supported by the holders. The container has a plurality of holders 310, 320, 330, 340, 350, and 360 defining respective support surfaces 311, 321, 331, 341, 351, and 361. The container has a bottom wall having a surface 301 and a sidewall 302 to help define a generally cylindrical interior region in container 300 with a generally circular opening at or near the top of container 300. The inner diameter of the generally cylindrical interior region in a specific embodiment may be in the range of, for example, approximately 3 inches to approximately 6 inches.

Although container 300 is illustrated in FIG. 3 as having an integral body, the container may be formed from separate pieces. The container this provides an ampoule for vaporizing material for delivery to processing equipment.

As illustrated in FIG. 3, holder 310 may be positioned over bottom surface 301 to define support surface 311 over bottom surface 301, holder 320 may be positioned over holder 310 to define support surface 321 over support surface 311; holder 330 may be positioned over holder 320 to define support surface 331 over support surface 321; holder 340 may be positioned over holder 330 to define support surface 341 over support surface 331; holder 350 may be positioned over holder 340 to define support surface 351 over support surface 341; and holder 360 may be positioned over holder 350 to define support surface 361 over support surface 351. Although illustrated in FIG. 3 as using six holders 310, 320, 330, 340, 350, and 360, any suitable number of holders may be employed in various embodiments of the vaporizer.

As illustrated in FIG. 3, a generally annular support 304 may be placed on bottom surface 301 in the interior region of container 300 to support holder 310 above bottom surface 301. A tube 305 may then extend through openings in holders 360, 350, 340, 330, 320, and 310 in a generally central portion of the interior region of container 300 to a location between holder 310 and bottom surface 301.

As one example, the vaporizer of FIG. 3 may be modified by coupling a baffle or diffuser at the end of tube 305 to help direct gas flow over material supported on bottom surface 301. In embodiments in which gas is introduced at or near a lowermost holder supporting material to be vaporized, introduced gas may be directed to flow over and/or through material supported by the lowermost holder using any suitable structure.

As illustrated in FIG. 3, container 300 may have a collar around the opening at the top of container 300, and a lid 306 may be positioned over the collar and secured to the collar using screws, such as screw 307 for example. A groove may optionally be defined around the opening at the top of the collar to help position an O-ring 308 between container 300 and lid 306. O-ring 308 may be formed from any suitable material such as, for example, Teflon®, any suitable elastomer, or any suitable metal, such as stainless steel for example. Lid 306 may define through a generally central region of lid 306 an opening through which a passage or inlet defined at least in part by tube 305 may extend into the interior region of container 300. As lid 306 is secured to the collar for container 300, lid 306 may press against O-ring 308 to help seal lid 306 over the collar and may press against a collar around tube 305 to help press lid 306 against holders 360, 350, 340, 330, 320, and 310. An O-ring for holders 360, 350, 340, 330, 320, and 310 may then be compressed to help seal holders 360, 350, 340, 330, 320, and 310 against one another and/or against tube 305. A valve 381 having an inlet coupling 391 may be coupled to tube 305 to help regulate the introduction of gas into container 300. Lid 306 may also define an opening through which a passage or outlet defined at least in part by a tube may extend into container 300. A valve 382 having an outlet coupling 392 may be coupled to the tube to help regulate the delivery of gas from the container.

As illustrated in FIG. 3, a generally circular frit 370 may be positioned over top holder 360 to help filter solid material from gas flow directed over material supported by holder 360 prior to delivery through the outlet defined through lid 306. Frit 370 may define through a generally central region of frit 370 a generally circular opening through which tube 305 may extend. Frit 370 may be pressed over holder 360 in any suitable manner using any suitable structure as lid 306 is secured to container 300 to help seal frit 370 over holder 360. The vaporizer may comprise in addition to or in lieu of frit 370 a frit positioned in the passage or outlet for gas delivery from container 300 and/or one or more frits positioned in one or more passageways through one or more of holders 310, 320, 330, 340, 350, and 360. The frit(s) in the vaporizer may additionally be coated with $Al_2O_3$. In like manner, any other internal components in the vaporizer may be coated with $Al_2O_3$, so that all surfaces and components in the interior volume of the vaporizer are coated with $Al_2O_3$.

In the FIG. 3 vaporizer, a bypass passage defined by tubing 395 coupled between valves 381 and 382 may be used to help purge valves 381 and 382, inlet coupling 391, and/or outlet coupling 392. A valve 383 may optionally be coupled to tubing 395 to help regulate fluid flow through the bypass passage. An inlet/outlet coupling 397 may optionally be used to help define an additional inlet/outlet for the interior region of container 300 to help purge the interior region.

Figure 4:
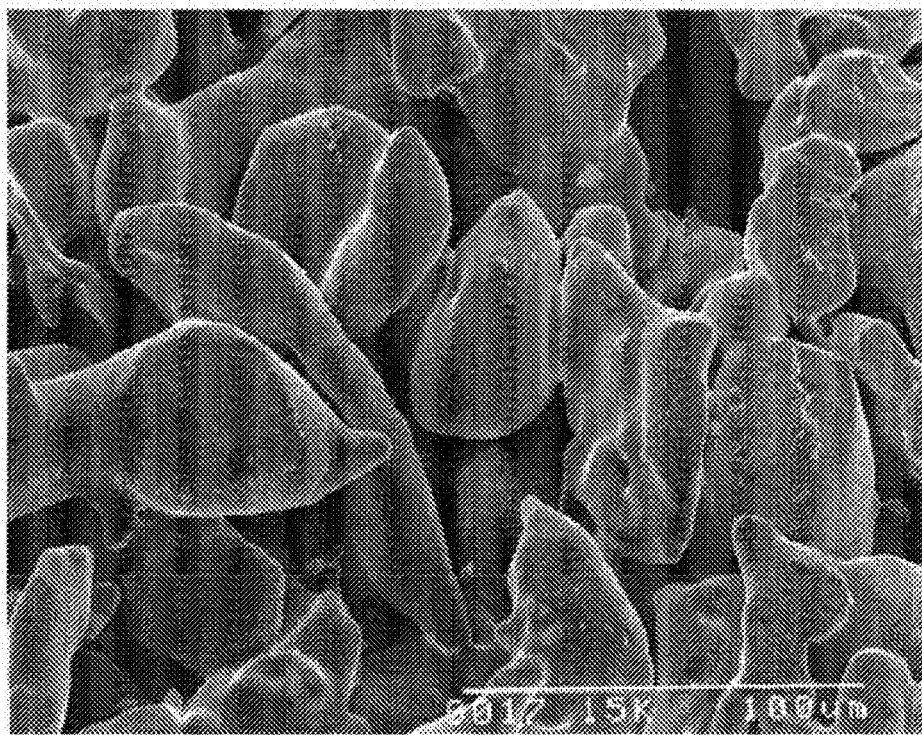
FIG. 4 is a micrograph, at 15K magnification, of the surface of a porous metal frit of a type usefully employed in filter cements, according to another aspect of the disclosure.

FIG. 4 is a micrograph, at 15K magnification, of the surface of a porous metal frit of a type usefully employed in filter elements, according to another aspect of the disclosure.

The high surface area of the frit can be advantageously coated by ALD, wherein metal precursor and oxidizing co-reactant reach the surface in separate, self-limiting pulses. To coat the fit with $Al_2O_3$ alternating pulses of trimethylaluminum and water or $O_3/O_2$ mixtures may be employed. Specific conditions can be empirically determined by increasing the pulse lengths of each step until all surfaces are coated. Deposition temperatures from 100-400° C. may be employed to deposit useful films in specific embodiments.

It will be appreciated that other aluminum sources may be employed in the broad practice of the present disclosure, as for example $AlCl_3$, other $AlR_3$ (alkyl) compounds wherein $R_3$ is an organo moiety, or other volatile Al compounds. Other oxygen sources such as $N_2O$, $O_2$, alcohols, peroxides, etc. can also be used with the aluminum source reagents to deposit $Al_2O_3$ or related $AlO_x$ materials, in such practice of the present disclosure.

The features and advantages of the present disclosure are more fully shown by the following examples, which are of illustrative character to facilitate understanding of the disclosure.

Example 1

Electropolished 316L stainless steel samples were rinsed with isopropanol to clean the surface. Two samples were coated with $Al_2O_3$ by atomic layer deposition (ALD). One sample was subjected to 100 ALD cycles of trimethylaluminum/purge/water/purge and the other sample was subjected to 1000 cycles of the same ALD process. The deposition temperature was 150° C. Two samples were not coated. Both coated samples and one of the uncoated samples were loaded into a glass ampoule with solid $AlCl_3$ powder in a nitrogen-purged glovebox to prevent moisture or oxygen from interacting with the samples or with the $AlCl_3$. The glass ampoule was then sealed with a PTFE cap. The ampoule with $AlCl_3$ and stainless steel samples was heated to 120° C. for 10 days. At the end of 10 days, the ampoule was cooled and brought back into the glovebox. The samples were removed from the $AlCl_3$ under this inert environment. The mass gain of the samples was 0.4 to 0.7 mg (<0.15%). All of the surfaces looked pristine to the eye. Next, these three samples and an additional sample that had not seen any exposure to $AlCl_3$ were examined in the scanning electron microscope (SEM) on their top surfaces and then cross-sectioned by focused ion beam (FIB) to determine whether there was any attack of the surface.

Figure 5:
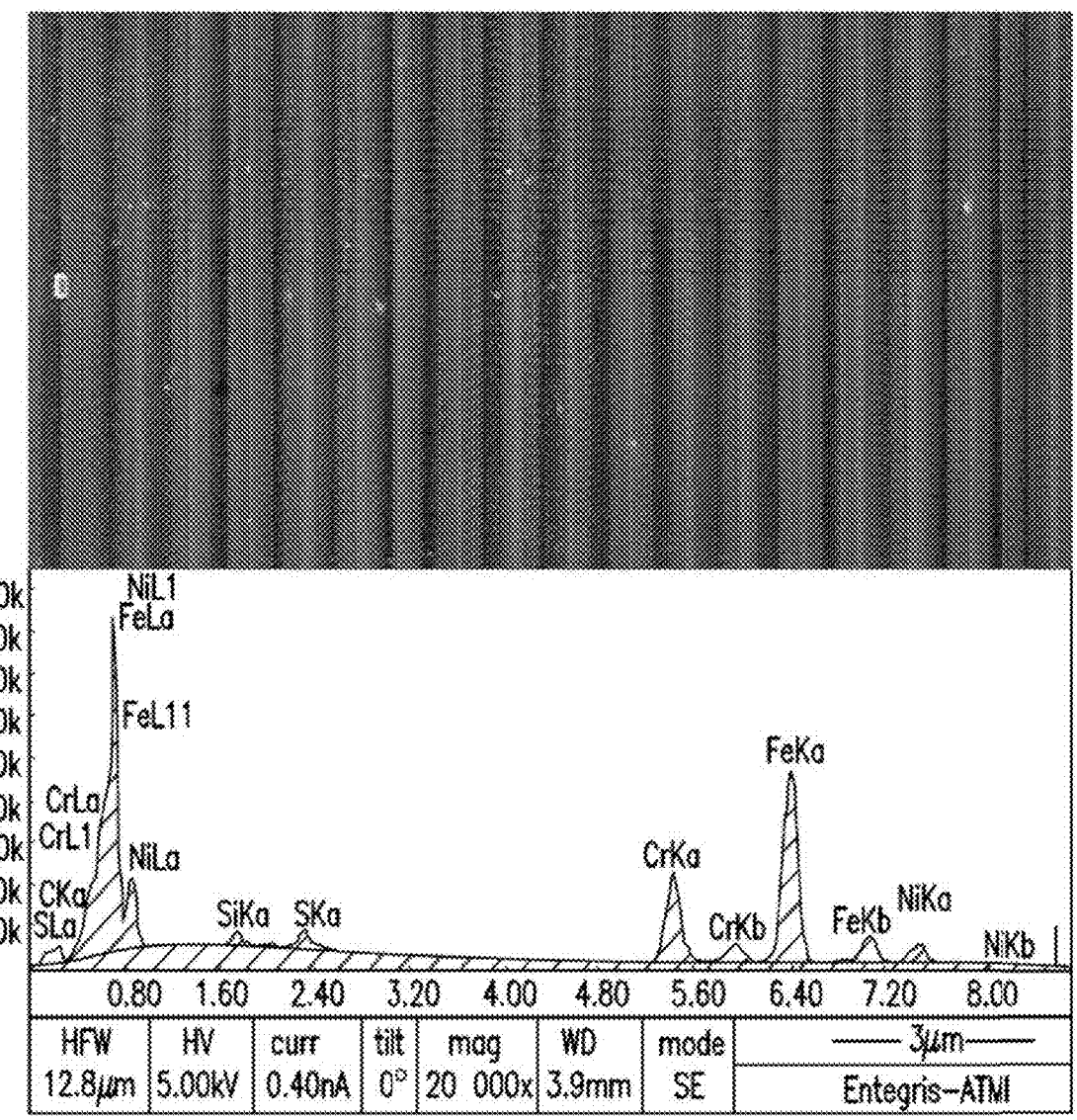
FIG. 5 is a micrograph, at 20,000 times magnification, of the surface of electropolished 316 L stainless steel having no exposure to $AlCl_3$.

FIG. 5 shows the surface images of a sample that did not see any $AlCl_3$. The surface of this sample is clean and shows the major elements of the stainless steel: Fe, Cr, and Ni.

Figure 6:
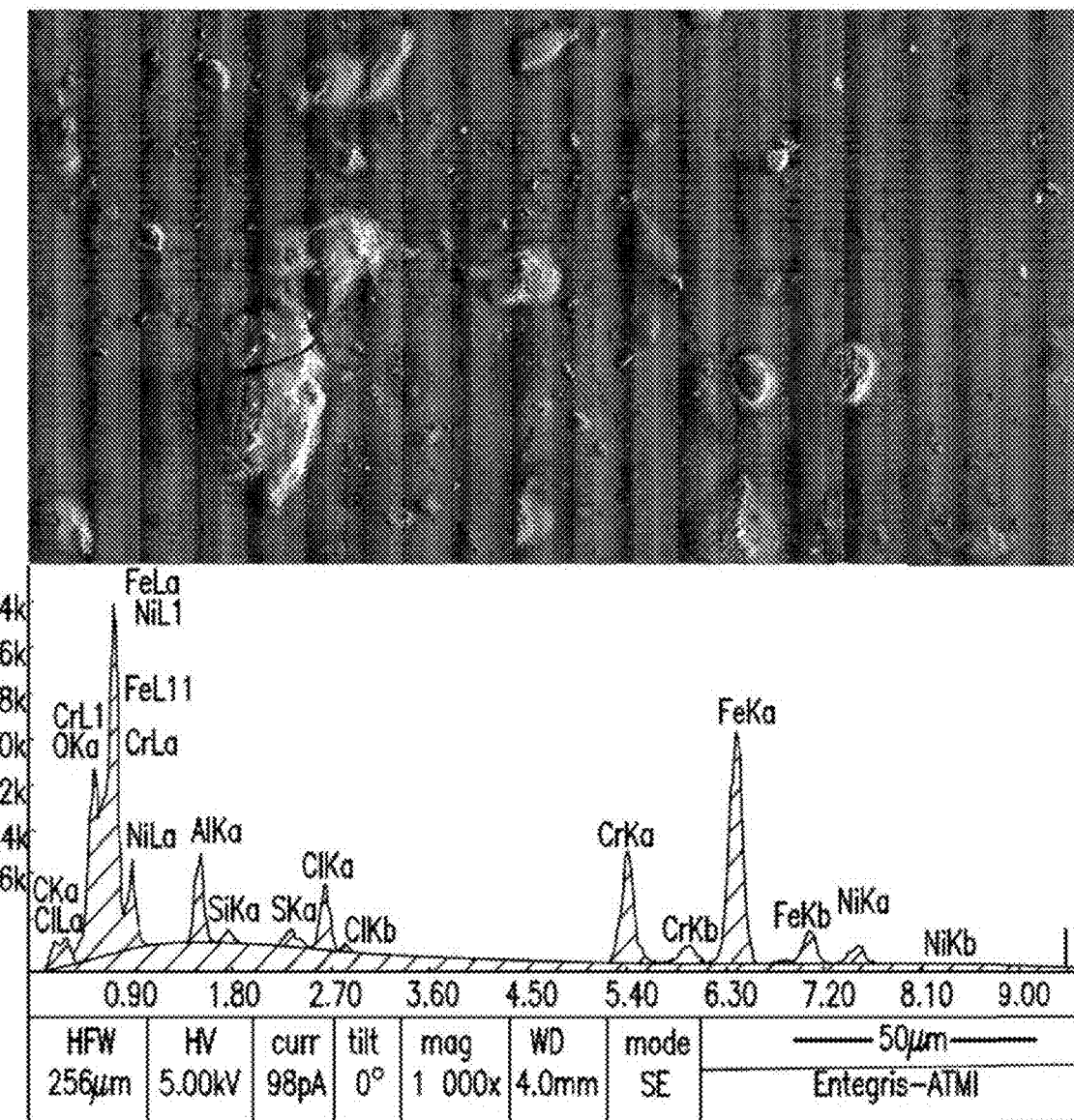
FIG. 6 is a micrograph, at 1000 times magnification, of a surface of electropolished 316 L stainless steel after exposure to $AlCl_3$ for 10 days at 120° C. in an anhydrous environment.

FIG. 6 shows the uncoated sample that was exposed to $AlCl_3$. It can be seen that there is significant surface residue on this sample with the addition of Al and Cl to the major components of the stainless steel.

Figure 7:
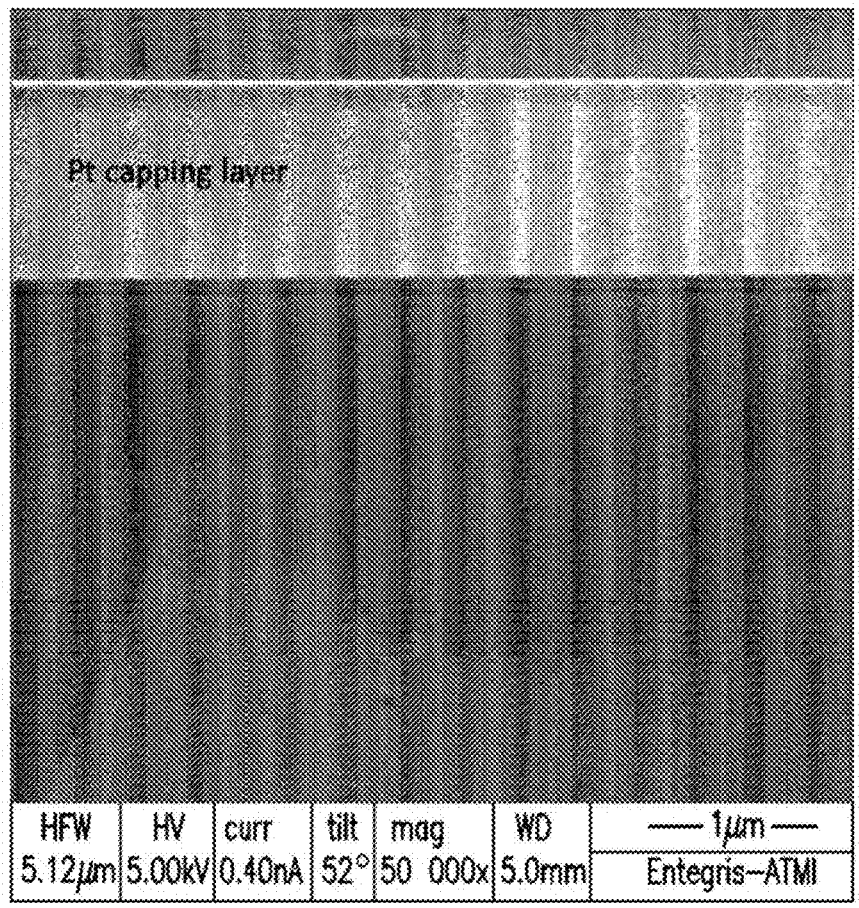
FIG. 7 is a micrograph, at 50,000 times magnification, of a cross-section of electropolished 316 L stainless steel that did not have any exposure to $AlCl_3$.

FIG. 7 shows a cross-section of the sample that was not exposed to $Al_3Cl_3$. It is clear that there is no surface attack.

Figure 8:
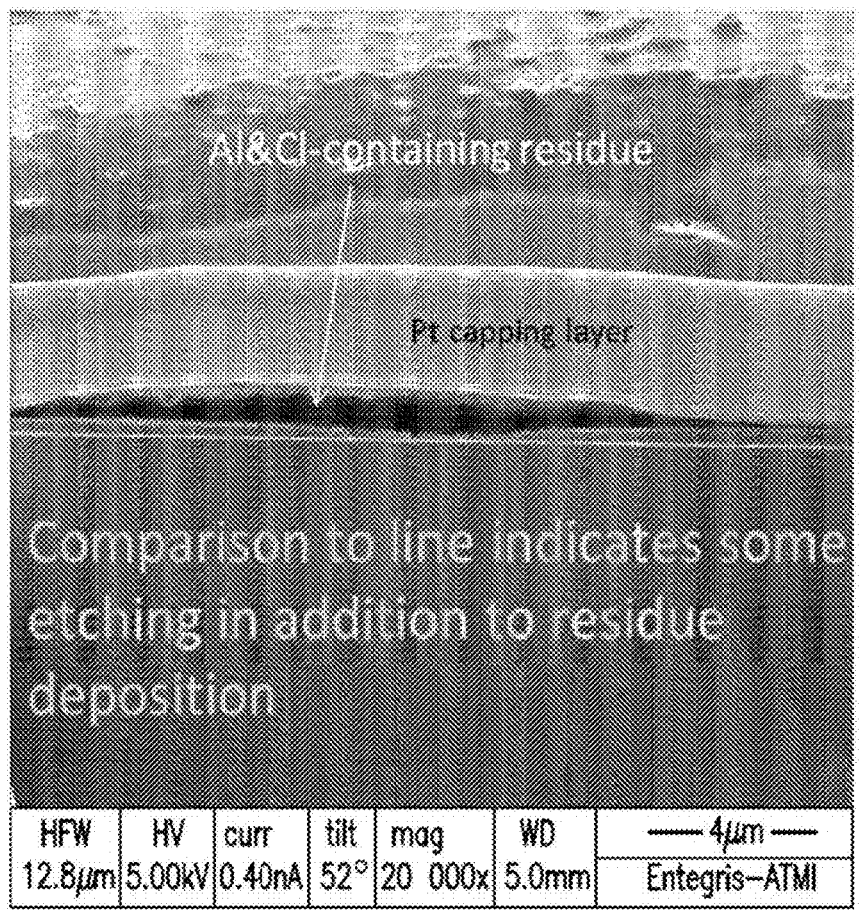
FIG. 8 is a micrograph, at 20,000 times magnification, of uncoated 316 L stainless stool after 10 days of exposure to $AlCl_3$ at 120° C. in an anhydrous environment.

FIG. 8 shows the uncoated sample that was exposed to $AlCl_3$. There is a line to compare to the surface so that it is clear that there was surface attack of 0.1 to 0.2 microns underneath the area that had Al- and Cl-containing residue.

Figure 9:
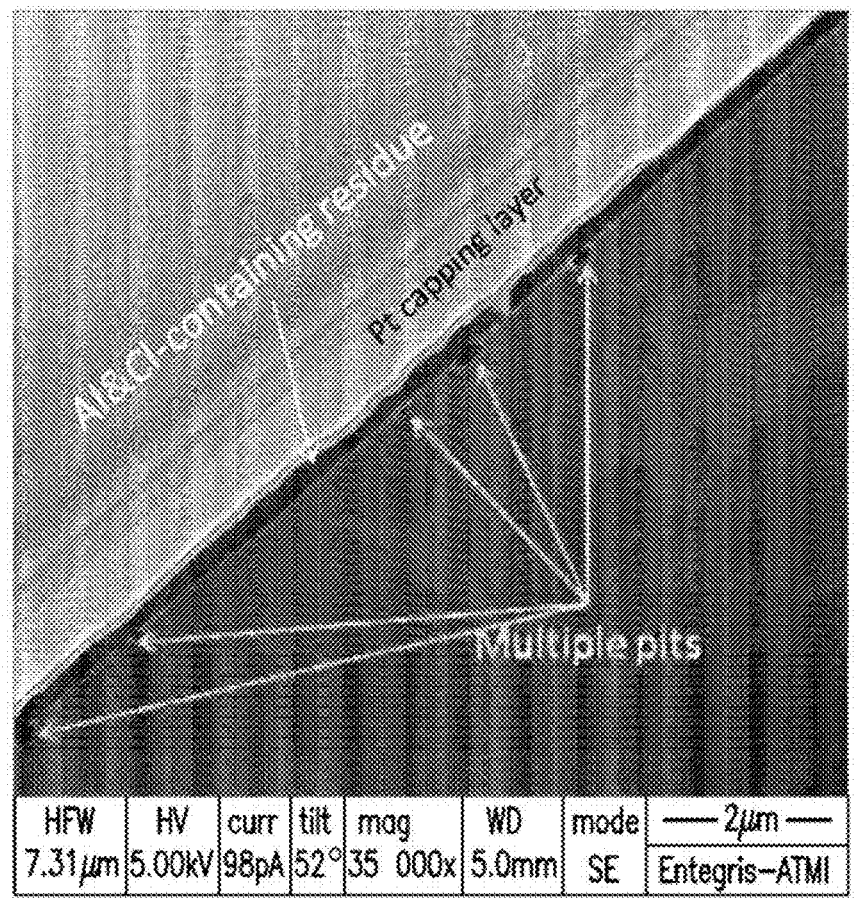
FIG. 9 is a micrograph, at 35,000 times magnification, of electropolished 316 L stainless steel after 10 days of exposure to $AlCl_3$ at 120° C. in an anhydrous environment, showing multiple pits along the surface.

FIG. 9 shows a different area of the sample that was exposed to $AlCl_3$, with no surface coating. Native oxide is present on the untreated stainless steel surface. In this area, multiple pits are clearly visible.

Figure 10:
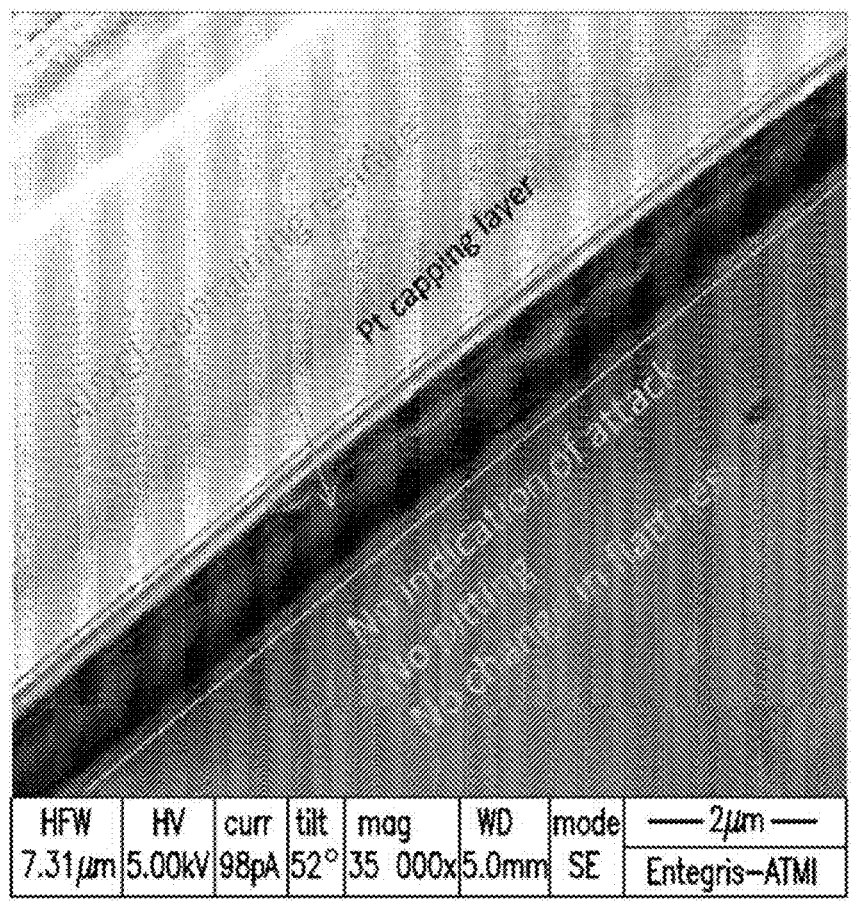
FIG. 10 is a micrograph, at 35,000 times magnification, of electropolished 316 L stainless steel coated by 100 ALD cycles of $Al_2O_3$ using trimethyl aluminum and water, prior to exposure to anhydrous $AlCl_3$ at 120° C. for 10 days.

In contrast, FIG. 10 shows the cross-section of the surface that had a coating of 100 cycles of $TMA/H_2O$ prior to exposure to $AlCl_1$ at 120° C. In this case there is still Al- and Cl-containing residue adhered to the surface, but there is no evidence of any attack of the surface of the stainless steel.

Figure 11:
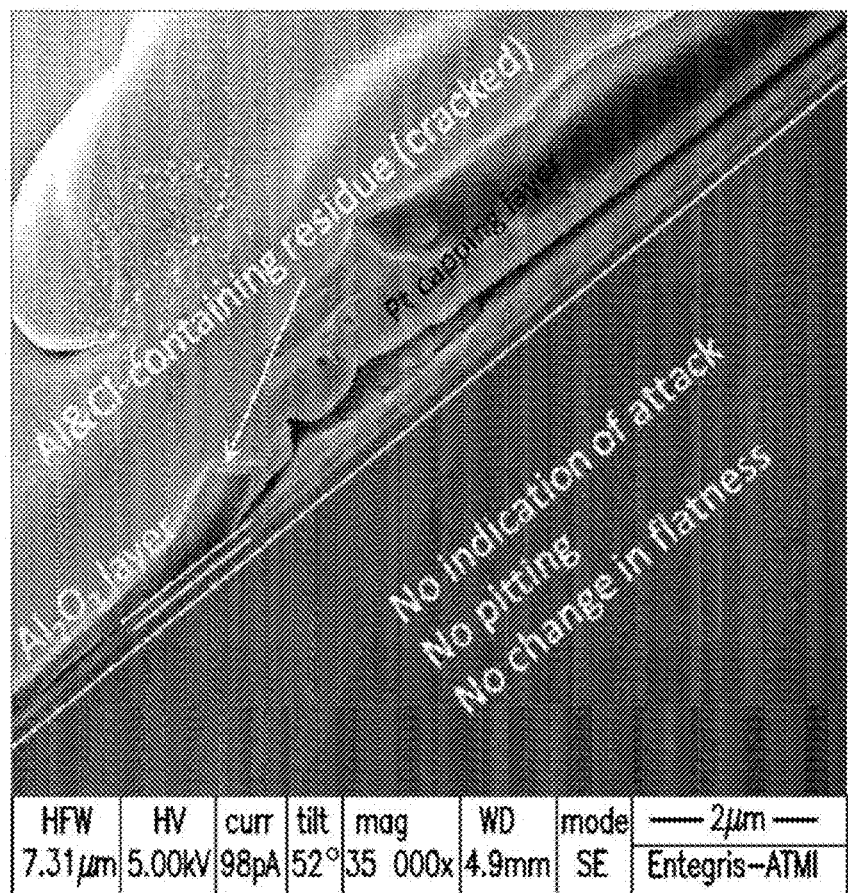
FIG. 11 is a micrograph, at 35,000 times magnification, of electropolished 316 L stainless steel coated by 1000 ALD cycles of $Al_2O_3$ using trimethyl aluminum and water, prior to exposure to anhydrous $AlCl_3$ at 120° C. for 10 days.

Likewise, FIG. 11 shows the cross-section of the surface that had a coating of 1000 cycles of $TMA/H_2O$ prior to exposure to $AlCl_3$ at 120° C. In this case there is still Al- and Cl-containing residue adhered to the surface, but there is no evidence of any attack of the surface of the stainless steel.

Example 2

In a specific empirical assessment, the efficacy of alumina coatings was evaluated, in exposure to aluminum trichloride ($AlCl_3$) in a first test, and in exposure to tungsten pentachloride ($WCl_5$) in a second test.

In the first test, sample coupons of electropolished 316L stainless steel were either coated with 470 Å of $Al_2O_3$ or uncoated. One sample of each type was placed in one of two containers with solid $AlCl_3$. Both of the containers were loaded, sealed, and pressurized to 3 psig with helium inside of a $N_2$ purged glovebox, with $O_2$ and $H_2O$ levels below 0.1 ppm. Outboard He leak tests determined that one of the containers had a leak rate below 1E-6 standard cubic centimeter per second (scc/s), which was the resolution limit of the measurement, and the other container had a leak rate of 2.5E-6 scc/s. The containers were heated in the same oven to 155° C. for nine days, cooled, and the coupons were removed in the glovebox. Table 2 shows the mass changes of the various coupons.

TABLE 2

Mass Changes of various coupons soaked in AlCl$_3$ for 9 days at 155° C.

| sample type | ID | leak rate scc He/s | initial mass g | post mass g | change g | % change |
|---|---|---|---|---|---|---|
| coated coupon | 2 | 2.50E−06 | 3.3986 | 3.3967 | −0.0019 | −0.06% |
| coated coupon | 3 | <1E−6 | 3.3896 | 3.3896 | 0.0000 | 0.00% |
| uncoated coupon | 12 | 2.50E−06 | 3.3913 | 3.3824 | −0.0089 | −0.26% |
| uncoated coupon | 13 | <1E−6 | 3.4554 | 3.4554 | 0.0000 | 0.00% |

Figure 12:
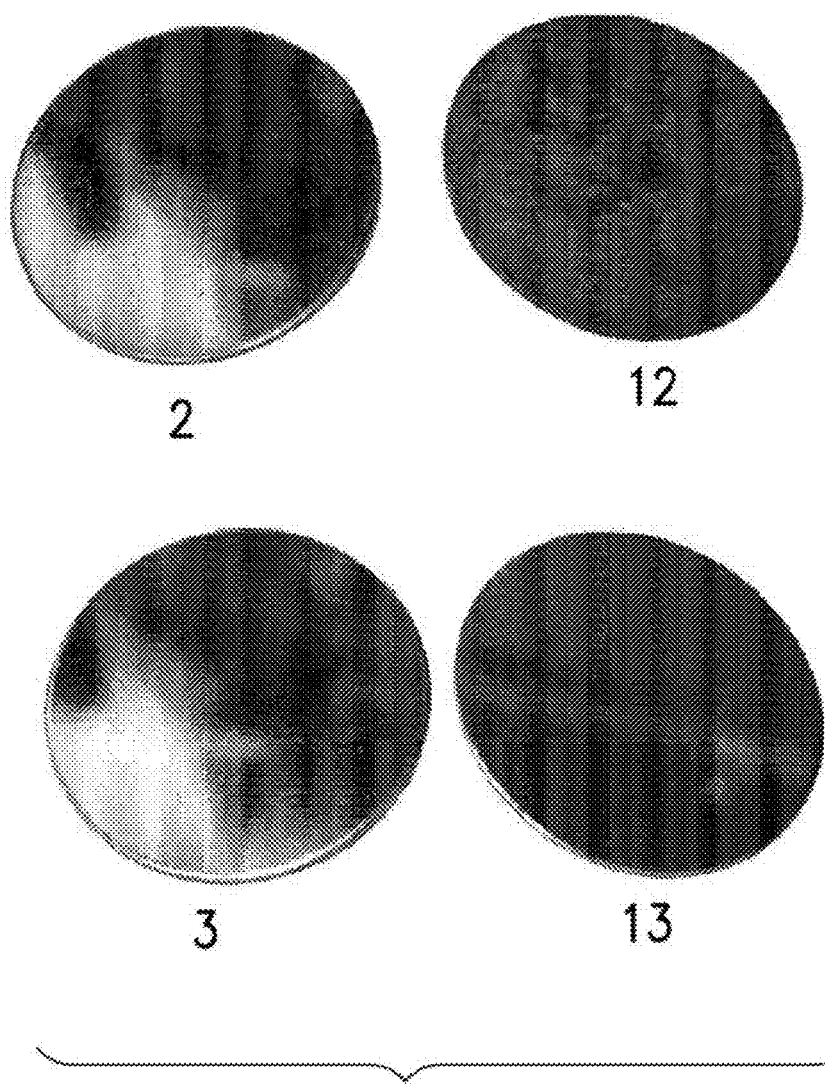
FIG. 12 is a composite photograph of sample stainless steel coupons, of which sample coupons 2 and 3 were coated with a 470 Å thick coating of alumina, and sample coupons 12 and 13 were uncoated, has photographed after nine days exposure to $AlCl_3$ at 155° C.

FIG. 12 is a composite photograph of the sample coupons of Table 2 after the nine-day exposure to AlCl$_3$ at 155° C., in which the respective coupons are identified by the same ID numbers as are set out in Table 2.

From Table 2 it is evident that the mass changes were only quantifiable when there was a measurable leak of the container. In this corrosive exposure, the loss of mass of the samples as tabulated in Table 2 and the composite photograph of the respective sample coupons in FIG. 12 show that the coated sample coupon 2 was in substantially better condition than the uncoated sample coupon 12 after the nine-day exposure to ACl$_3$ at 155° C. There was no change in the Al$_2$O$_3$ coating thickness as measured by XRF.

In the second test, sample coupons of electropolished 316L stainless steel were either coated with 470 Å thick coatings of Al$_2$O$_3$ or were uncoated. Sample coupons were placed in containers with solid WCl$_5$, with 165° C., 180° C. and 220° C. temperature conditions being maintained in respective containers. All of the containers were loaded and sealed inside of a N$_2$ purged glovebox, with O$_2$ and H$_2$O levels below 0.1 ppm. The containers then were heated in an oven for ten days, cooled, and the sample coupons were removed from the respective containers, in the glovebox.

Thickness measurements were made by x-ray fluorescence (XRF) spectroscopy technique, to assess change in coating thickness of the alumina coating, from initial measured thickness. Table 3 contains the XRF measurements of Al$_2$O$_3$ thickness before and after exposure to WCl$_5$, for two sample coupons maintained at 165° C. for 10 days in such exposure, for two sample coupons maintained at 180° C. for 10 days in such exposure, and for one sample coupon maintained at 220° C. for 10 days in such exposure. Approximately 15-30 Å of the coating was typically etched away in the cleaning process.

TABLE 3

XRF measurements of Al$_2$O$_3$ film thickness before and after exposure to WCl$_5$ at various temperatures for 10 days.

| T ° C. | Initial AlOx thickness, Å | Final AlOx thickness, Å | Change in thickness, Å |
|---|---|---|---|
| 165 | 462.4 | 439.6 | −22.8 |
| 165 | 467.5 | 450.8 | −16.7 |
| 180 | 474.8 | 447.8 | −27.0 |
| 180 | 477.5 | 411.7 | −65.8 |
| 220 | 476.1 | 182.8 | −293.4 |

Figure 13:
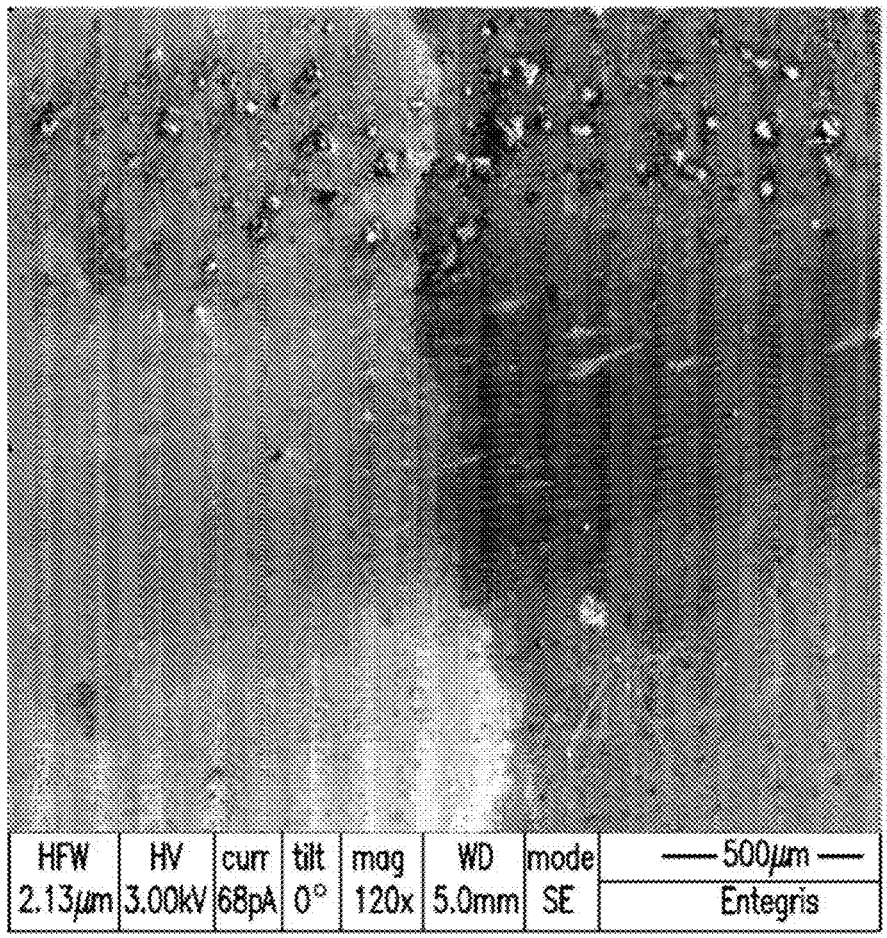
FIG. 13 is a top-down scanning electron microscope (SEM) micrograph of an alumina-coated stainless steel sample after exposure to $WCl_5$ at 220° C. for 10 days.
Figure 14:
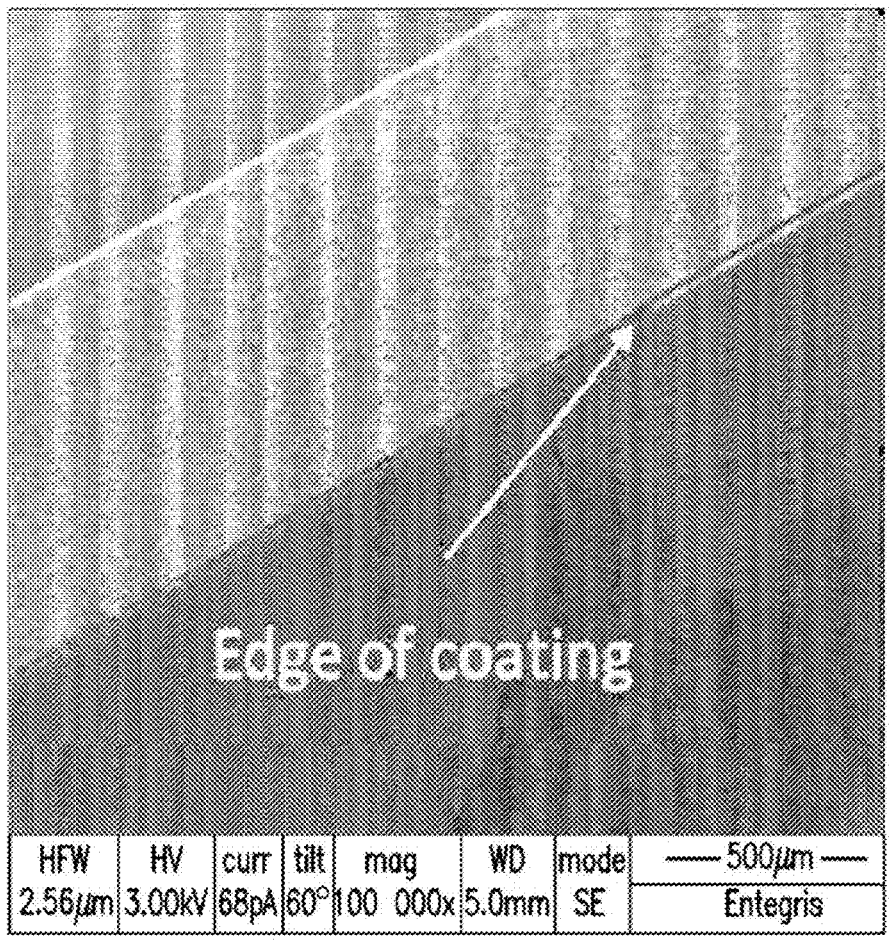
FIG. 14 is a focused ion beam (FIB) cross-section of the edge of the coating in the sample of FIG. 13 after exposure to $WCl_5$ at 220° C. for 10 days.

FIG. 13 is a top-down scanning electron microscope (SEM) micrograph of the sample exposed to WCl$_5$ at 220° C. for 10 days, and FIG. 14 is a focused ion beam (FIB) cross-section of the edge of the coating in such sample.

Coated and uncoated samples in this second test showed no sign of corrosion visually or by SEM examination or by weight change. However, at the higher temperature, a significant amount of the Al$_2$O$_3$ coating was removed. Both samples at 165° C. were etched in an amount consistent with the cleaning process. One of the samples at 180° C. lost 27 Å of thickness, consistent with cleaning, but the other sample lost approximately 66 Å of thickness, which is significantly above that of cleaning. At 220° C., about 60% of the coating was removed, as shown in FIG. 13 in which the alumina coating is removed in some areas (lighter area portion) and is intact in others (darker area portion). In FIG. 14, the micrograph shows the coating intact to the right, and the edge of the coated area is indicated by the arrow.

It will be recognized that although the disclosure is directed illustratively to semiconductor manufacturing equipment, the protective coating approach of the present disclosure is likewise applicable to other gas processing apparatus for the manufacture of other products, such as flat-panel displays, photovoltaic cells, solar panels, etc. where surfaces in the process equipment are susceptible to attack by vapor phase components that react with oxides on such services to form reaction products that are deleterious to the products made and processes conducted with such equipment.

Set out below is a further aspect of the disclosure relating to thin film atomic layer deposition coatings.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention.

It must also be noted that as used herein, the singular forms "a", "an", and "the" include plural reference unless the context clearly dictates otherwise. Thus, for example, reference to a "layer" is a reference to one of more layers and equivalents thereof known to those skilled in the art, and so forth. Unless defined otherwise, all technical and scientific terms used herein have the same meanings as commonly understood by one of ordinary skill in the art.

Methods and materials similar or equivalent to those described herein can be used in the practice or testing of embodiments of the present disclosure. All publications mentioned herein are incorporated by reference in their entirety. Nothing herein is to be construed as an admission that the invention claimed herein is not entitled to antedate such publications by virtue of prior invention. "Option" or "optionally" means that the subsequently described event or circumstance may or may not occur, and that the description includes instances wherein the event occurs and instances where it does not. All numeric values herein can be modified by the term "about," whether or not explicitly indicated. The term "about" generally refers to a range of numbers that one of skill in the art would consider equivalent to the recited value (i.e., having similar function or result). In some embodiments the term "about" refers to ±10% of the stated value, in other embodiments the term "about" refers to ±2% of the stated value. While compositions and methods are described in terms of "compromising" various components and steps, such terminology should be interpreted as defining essentially closed or closed member groups.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 50, 20, 10, or 1 micrometers, or in various thin film regimes below 200, 100, 50, 20, or 10 nanometers, depending on the specific application involved. As used herein, the term "thin film" means a layer of a material having a thickness below 1 micrometer.

Although the disclosure has been set forth herein with respect to one or more implementations, equivalent alterations and modifications will occur to others skilled in the art based upon a reading and understanding of this specification. The disclosure includes all such modifications and alterations. In addition, while a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are herein, such terms are intended to be inclusive in a manner similar to the term "comprising." Also, the term "exemplary" is merely meant to mean an example, rather than the best. It is also to be appreciated that features, layers and/or elements depicted herein are illustrated and/or taught with particular dimensions and/or orientations relative to one another for purposes of simplicity and ease of understanding, and that the actual dimensions and/or orientations may differ substantially from that illustrated and/or taught herein.

Thus, the disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure correspondingly contemplates such features, aspects and embodiments, or a selected one or ones thereof, in various permutations and combinations, as being within the scope of the present disclosure. Further, the disclosure contemplates embodiments that may be defined by exclusion of any one or more of the specific features, aspects, or elements that are disclosed herein in connection with other embodiments of the disclosure.

In accordance with one aspect of the present disclosure, there is provided a thin film coating comprised of one of more layers, where at least one layer is deposited by atomic layer deposition.

In accordance with aspects of the disclosure, the following are provided:

ALD coating with a film thickness of more than 1 Å and in some applications more than 10,000 Å

ALD coating providing a very dense, pine-hole-free, defect-free layer.

Thin film coating intended for deposition applications on a multitude of parts, but not directly for the actual IC device (transistor) manufacturing on a Si wafer.

ALD coating may be comprised of insulating metal oxides such as alumina ($Al_2O_3$), yttria ($Y_2O_3$), zirconia ($ZrO_2$), titania ($TiO_2$), etc., and metals such as platinum, niobium, or nickel.

ALD coating may be deposited between RT (room temperature) and 400° C.

ALD coating may be a single film with a defined stoichiometry, such as for example a 1 micron thick alumina layer, or several layers such as for example {0.25 micron titania+0.5 micron alumina+0.25 micron zirconia} or a true multilayer structure, such as for example {1 atomic layer titania+2 atomic layers alumina}×n, with n being in a range of 1 to 10,000, or combinations thereof.

The thin film coating where the ALD layer is combined with another layer that is deposited by a different deposition technique, such as PE-CVD, PVD, spin-on or sol-gel deposition, atmospheric plasma deposition, or the like.

Total film thickness between 1 micron and 100 microns.

Portion of ALD coating thickness of the entire stack to be less or equal than 2 microns, with the 2 microns being in one or more distinct layers.

Other coating materials being selected from the group of oxides, such as alumina, aluminum-oxy nitride, yttria, yttria-alumina mixes, silicon oxide, silicon oxy-nitride, transition metal oxides, transition metal oxy-nitrides, rare earth metal oxides, rare earth metal oxy-nitrides.

Ability to pattern ALD coating:

Method 1: Uniformly coat part and then etch back unwanted materials through a mask (the etch back can be mechanical, e.g., bead blast, physical, e.g., plasma ions, or chemical, e.g., plasma or wet etch).

Method 2: Mask unwanted area, ALD coat and then remove masked areas. The mask can be a sealed sheet, or fixture or photo resist (lift-off technique).

Method 3: Create pattern on substrate with a surface termination that blocks the ALD film growth. For example, a surface termination layer may be employed that has "zero" sticking coefficient for $H_2O$ and TMA (trimethylaluminum). As used herein, a surface termination layer is a self-limiting layer, e.g., a self-limiting ALD layer. As used herein, the sticking coefficient is the ratio of the number of adsorbate atoms (or molecules) that adsorb, or "stick," to a surface, to the total number of items that impinge on that surface during the same period of time.

In accordance with aspects of the disclosure, the following applications are provided:

Applications:

Defect-free, pin-hole-free, dense, electrical insulation of parts.

Ability to coat parts with high-aspect ratio features. Examples: (1) Parts with deep holes, channels and 3-dimensional features, (2) hardware such as screws and nuts, (3) porous membranes, filters, 3-dimensional network structures, (4) structures with connected pore matrices.

Electrical insulation layer High dielectric breakdown strength and high electrical resistance (low leakage). This is achieved with ALD $Al_2O_3$. Using multi-layers of titania-alumina-zirconia (TAZ) further improve electrical insulator performance. There are various multi-layer-configurations:

X nm $TiO_2$+Y nm $Al_2O_3$+Z nm $ZrO_3$

[U nm $TiO_2$+V nm $Al_2O_3$+W nm $ZrO_2T$] times $n$

X nm $TiO_2$+[V nm $Al_2O_3$+W nm $ZrO_2T$] times $m$ etc.; wherein X, Y, Z, U, V, and W may each be in a range of from 0.02 nm to 500 nm, and wherein each of n and m may be in a range of from 2 to 2000.

Chemical and etch-resistant coating: The ALD layer can be alumina, yttria, ceria, or similar. The total etch resistant coating may be comprised of (1) ALD layer only, (2) combination of PVD, CVD, and ALD, (3) ALD may be overcoat and serve as sealant layer, as discussed more fully hereinafter, (4) ALD may be underlayer to provide robust foundation, and (5) ALD may be interspersed between CVD and/or PVD coating layers.

The ALD coating may provide chemical resistance for applications such as advanced batteries, gas filters, liquid filters, electro-plating tool components, plasma-wetted components (to protect against fluorine and other halogen attack), etc.

The ALD coating may serve as corrosion-resistant coating

Diffusion barrier layer; the ALD layer, which is dense, conformal and pin-hole free provides excellent trace metal diffusion barrier characteristics The ALD layer may serve as an adhesion layer between an underlying substrate (glass, quartz, aluminum, anodized aluminum, alumina, stainless steel, silicon, SiOx, AlON, etc.) and an overlying coating layer (PVD yttria, PVD AlON, PVD $Al_2O_3$, CVD SiOx, CVD $SiO_xN_y$, CVD $Al_2O_3$, CVD $AlO_xN_y$, DLC, Si, SiC, etc.)

In accordance with another aspect of the disclosure, an ALD-deposited surface sealant layer is used for coatings. ALD (atomic layer deposition) is an established technology, which uses chemical adsorption of two or more alternating precursors to form very dense, nearly perfectly arranged (physically and stoichiometrically) thin films. The technique allows for precisely controlled film growth, is nearly 100% conformal and will grow films at any surface location that the precursor gas can reach, including within very high aspect ratio features. In this respect, an ALD-deposited sealant coating can be used for the following applications:

(1) to overcoat and seal an existing surface and therefore provide enhanced and superior properties of that surface/part (2) to apply an ALD sealing coating on top of a CVD, PVD, spray- or other coating to provide a sealant for the imperfections of that coating, such as:

(i) filling any cracks near the coating surface and therefore providing a surface that is impermeable to corrosive and etching environments (ii) filling and sealing any macropores, coating defects, intrusions, etc. to provide a coating surface layer that is impermeable to gases and liquids and terminated with a controlled smooth, conformal sealant layer (iii) reducing surface roughness and overall surface area of the coating, thus providing a smooth and dense surface layer that allows for minimal attack in corrosive environments (iv) minimizing particle generation, improving hardness, toughness and scratch resistance by providing a dense and smooth sealed surface with overcoat In various aspects of the disclosure, the ALD sealant may be applied to parts and surfaces that require:

(a) improved etch and corrosion resistance, and/or (b) reduced friction, wear, and improved mechanical abrasion resistance The ALD sealant layer at the same time may also serve as a diffusion barrier, and it has the ability to control surface electrical properties as well as the surface termination, such as hydrophilicity and hydrophobicity.

A further aspect of the disclosure involves use of ALD technology with fibrous metal membranes with chemically resistant coatings like alumina, yttria, or other coatings of this type. The ALD technology allows gases to penetrate the porous filter and coats over the fibrous membrane providing resistance to corrosive gases.

This aspect of the disclosure provides a deposition gas-based technique that can penetrate small micron size openings and coat uniformly over the fibers.

This aspect of the disclosure has been demonstrated by depositing alumina coating can a 4-micron Ni-based gas filter made by Entegris, Inc. of Billerica, MA, U.S.A.

The ALD technology of this disclosure offers many benefits, such as:

1) Coating penetration into small features like micron size porosity of the filters ensuring complete coverage 2) Hermetic sealing of the fibers thus protecting the filter membranes 3) Various different coatings can be deposited used this technique The disclosure also contemplates use of ALD coatings to improve the processing characteristics of the substrate article or equipment that is coated. For example, ALD films may be employed to combat blistering or other undesired phenomena that may occur during annealing of substrate articles, due to mismatches in coefficient of thermal expansion between layers of a multilayer film article. Thus, ALD films may be employed in the multilayer film structure to ameliorate such material property differences, or otherwise to improve electrical, chemical, thermal, and other performance properties of the ultimate product article.

The disclosure further contemplates the use of ALD coatings to protect fluid-contacting surfaces of apparatus handling fluids that may present a risk of chemical attack in the use of such apparatus. Such apparatus may include for example fluid storage and dispensing packages employed to supply gas to semiconductor manufacturing tools, where the fluid may adversely affect the flow path components and downstream process equipment. Fluids that may present a specific issue in particular applications may include halide gases such as fluorides of boron or germanium. Thus, the coatings of the present disclosure may be employed to enhance the performance of process equipment, flow circuitry, and system components, in these and other applications.

In a further aspect, the disclosure relates to a composite ALD coating, comprising layers of different ALD product materials. The different ALD product materials may be of any suitable type, and may for example comprise different metal oxides, e.g., at least two metal oxides selected from the group consisting of titania, alumina, zirconia, oxides of the formula MO wherein M is Ca, Mg, or Be, oxides of the formula $M'O_2$, wherein M' is a stoichiometrically acceptable metal, and oxides of the formula $Ln_2O_3$ wherein Ln is a lanthanide element, such as La, Sc, or Y. In other embodiments, the composite ALD coating may include at least one layer of alumina. In still other embodiments, the composite ALD coating may include at least one layer of titania, or zirconia, or other suitable material.

Such composite ALD coating may comprise different metals as the different ALD product materials, e.g., at least two metals selected from the group consisting of platinum, niobium, and nickel. Any suitable differing metals can be employed.

In other embodiments, the different ALD product materials may comprise a metal oxide material as a first ALD product material in a first layer of the composite coating and a metal as a second ALD product material in a second layer of the composite coating. The metal oxide material may for example be selected from the group consisting of alumina, titania, and zirconia, and the metal is selected from the group consisting of platinum, niobium, and nickel.

The composite ALD coating described above may have any suitable number of layers, e.g., from 2 to 10,000 layers in the coating.

The disclosure in another aspect relates to a composite coating, comprising at least one ALD layer and at least one deposited layer that is not an ALD layer. The composite coating may for example be constituted, so that the at least one deposited layer that is not an ALD layer is selected from the group consisting of CVD layers, PE-CVD layers, PVD layers, spin-on layers, sprayed layers, sol gel layers, and atmospheric plasma deposition layers. In various embodiments, the layers in the composite coating may comprise at least one layer of material selected from the group consisting of alumina, aluminum-oxy nitride, yttria, yttria-alumina, silicon oxide, silicon oxy-nitride, transition metal oxides, transition metal oxy-nitrides, rare earth metal oxides, and rare earth metal oxy-nitrides.

The disclosure further contemplates a method of forming a patterned ALD coating on a substrate, comprising forming a pattern on the substrate of a layer of surface termination material that is effective to prevent ALD film growth. Such surface termination material in a particular implementation may exhibit an essentially zero sticking coefficient for water and trimethylaluminum. In various embodiments, the ALD coating may comprise alumina.

The disclosure further contemplates a method of filling and/or sealing surface infirmities of a material, said method comprising applying an ALD coating on a surface infirmity of the material, at a thickness effecting filling and/or sealing of the infirmity. The infirmity may be of any type, and may for example be selected from the group consisting of cracks, morphological defects, pores, pinholes, discontinuities, intrusions, surface roughness, and surface asperities.

Another aspect of the disclosure relates to a filter, comprising a matrix of fibers and/or particles, the fibers and/or particles being formed of metal and/or polymeric material, wherein the matrix of fibers and/or particles has an ALD coating thereon, wherein the ALD coating does not alter pore volume of the matrix of fibers and/or particles by more than 5%, as compared to a corresponding matrix of fibers and/or particles lacking said ALD coating thereon, and wherein when the fibers and/or particles are formed of metal, and the ALD coating comprises metal, the metal of the ALD coating is different from the metal of the fibers and/or particles.

The filter may be constructed with the matrix of fibers and/or particles in a housing that is configured for flow of fluid through the matrix for filtration of the fluid. In various embodiments, the ALD coating may comprise a transition metal, metal oxide, or transition metal oxide of suitable type. For example, the ALD coating may comprise a metal oxide selected from the group consisting of titania, alumina, zirconia, oxides of the formula MO wherein M is Ca, Mg, or Be, and oxides of the formula $Ln_2O_3$ wherein Ln is a lanthanide element, La, Sc, or Y. The ALD coating in various implementations comprises alumina. The matrix of the filter may comprise nickel fibers and/or particles, stainless steel fibers and/or particles, or fibers and/or particles of other materials such as polymeric materials, e.g., polytetrafluoroethylene. The filter may in various embodiments comprise pores of any suitable diameter. For example, the pores may be in a range of from 1 μm to 40 μm in some embodiments, and in other embodiments may be less than 20 μm, less than 10 μm, less than 5 μm or other suitable value, and in other embodiments may be in a range of from 1 to 10 μm, 1 to 20 μm, 20 to 40 μm, or other suitable range of values. The ALD coating itself may be of any suitable thickness, and in various embodiments may have thickness in a range of from 2 to 500 nm. In general, any suitable pore size and thickness characteristics may be employed, as appropriate for a specific end use or application.

The filter may be of suitable character as regards its retention rating. For example, the retention rating of the filter in specific embodiments may be characterized by log reduction value of 9 (denoted as 9LRV) for particles greater than 3 nm at a gas flow rate of 30 standard liters per minute gas flow or less. ALD-coated filters of the present disclosure may be employed in various applications in which the filter is desired to achieve a high efficiency rate of removal, as for example a rate of removal of 99.9999999%, determined at a most penetrating particle size, i.e., 9LRV, at a specific rated flow. The test methodology for evaluating 9LRV rating is described in Rubow, K. L., and Davis, C. B., "Particle Penetration Characteristics of Porous Metal Filter Media For High Purity Gas Filtration," Proceedings of the 37rd Annual Technical Meeting of the Institute of Environmental Sciences, pp. 834-840 (1991); Rubow, K. L., D. S. Prause and M. R. Eiscmann, "A Low Pressure Drop Sintered Metal Filter for Ultra-High Purity Gas Systems", Proc. of the 43rd Annual Technical Meeting of the Institute of Environmental Sciences, (1997); and Semiconductor Equipment and Materials International (SEMI) test method SEMI F38-0699 "Test Method for Efficiency Qualification of Point-of-Use Gas Filters," all of which are incorporated herein by reference.

Sintered metal filters/diffusers that may be coated with protective coatings by ALD in accordance with the present disclosure include the sintered metal filters/diffusers described in U.S. Pat. Nos. 5,114,447; 5,487,771; and 8,932,381, and in U.S. Patent Application Publication 2013/0305673.

Gas filters coated with protective coatings in accordance with the present disclosure may be variously configured. In specific illustrative embodiments, the filters may have a pore size in a range of from 1 to 40 μm, or in a range of from 1 to 20 μm, or in a range of from 20 to 40 μm, or other suitable values. Such gas filters may exist in stainless steel and nickel configurations. Both are susceptible to metals contamination when exposed to aggressive gas environments. The filter matrix of such gas filters may be over coated with chemically inert and robust thin films of alumina using ALD coating techniques in accordance with the present disclosure. The ALD process may include any number of depositions cycles, e.g., in a range of from 100 to 5000 cycles. In a specific implementation, the ALD alumina films may be deposited with 50 to 1500 cycles, using a trimethylaluminum/$H_2O$ process with extended wait and purge times, at temperature that may for example be in a range of 200° C. to 300° C., e.g., 250° C., with deposition of 0.75 Å to 1.25 Å per cycle, e.g., 1.1 Å/cycle.

The ALD alumina coating process may be carried out to provide alumina coating thicknesses on the gas filter that may for example be in a range of from 15 nm to 200 nm in various embodiments. In other embodiments, the ALD alumina coating thickness may be in a range of from 20 nm to 50 nm.

The above-described gas filter coatings as formed by ALD coating techniques may be carried out to provide varying aluminum content in aluminum oxide films. For example, the aluminum content of such films may be in a range of from 25 atomic percent to 40 atomic percent, in various embodiments. In other embodiments, the aluminum content is in a range of from 28 atomic percent to 35 atomic percent, and in still other embodiments, the aluminum content of the ALD coating is in a range of from 30 atomic percent to 32 atomic percent of the aluminum oxide film.

In other illustrative embodiments, the gas filter may comprise an in-line metal gas filter having pore size in a range of from 2 to 5 µm, in which the filter includes a titanium filter matrix, wherein the ALD alumina coating has a thickness that may be in a range of from 10 nm to 40 nm, e.g., 20 nm thickness. In still other embodiments, the gas filter may comprise a nickel-based gas filter matrix having pore size in a range of from 2 to 5 µm, wherein the ALD alumina coating has a thickness that may be in a range of from 10 nm to 40 nm, e.g., 20 nm thickness.

The protective coatings of the present disclosure may also be employed for coating of surfaces in chemical reagents supply packages, such as fluid storage and dispensing vessels, solid reagent vaporizer vessels, and the like. Such fluid storage and dispensing vessels may variously contain, in addition to the material to be stored in and dispensed from such vessels, storage media for the stored material, from which the stored material may be disengaged for dispensing of same from the vessel of the material supply package. Such storage media may include physical adsorbents on which fluids are reversibly adsorbed, ionic storage media for reversible fluid storage, and the like. For example, solid delivery packages of the type disclosed in International Publication WO2008/028170 published Mar. 6, 2008, the disclosure of which hereby is incorporated herein by reference in its entirety, may be coated on interior surface thereof with a protective coating of the present disclosure.

Chemical reagents supply packages of other types may be employed, in which internal surface of a supply vessel is coated with a protective coating of the present disclosure, such as internally pressure-regulated fluid supply vessels for delivery of gases, e.g., gases such as boron trifluoride, germanium tetrafluoride, silicon tetrafluoride, and other gases utilized in manufacture of semiconductor products, flat-panel displays, and solar panels.

A further aspect of the disclosure relates to a method of delivering a gaseous or vapor stream to a semiconductor processing tool, said method comprising providing a flow path for the gaseous or vapor stream, from a source of said gaseous or vapor stream to the semiconductor processing tool, and flowing the gaseous or vapor stream through a filter in the flow path to remove extraneous solid material from the stream, wherein the filter comprises a filter of a type as variously described herein.

In such method, the gaseous or vapor stream may comprise any suitable fluid species, and in particular embodiments, such stream comprises dialuminum hexachloride. A specific filter useful for such fluid applications includes an ALD coating comprising alumina, wherein the matrix comprises stainless steel fibers and/or particles.

The semiconductor processing tool in the aforementioned method may be of any suitable type, and may for example comprise a vapor deposition furnace.

As mentioned above, the filter may be varied in the ALD coating and matrix. In specific embodiments, the filter comprises a sintered matrix of stainless steel fibers and/or particles that is coated with an ALD coating of alumina, wherein the sintered matrix comprises pores of a diameter in a range of from 1 to 40 µm, e.g., from 1 to 20 µm, from 1 to 10 µm, from 10 to 20 µm, or in other suitable range of pore diameter values, and wherein the ALD coating in any of such embodiments has a thickness in a range of from 2 to 500 nm.

The disclosure in another aspect relates to use of ALD for pore size control in fine filtration applications, to achieve filters that are specifically tailored, beyond the capabilities afforded by sintered metal matrix filters alone. In this respect, control the pore sizes in sintered metal matrix filters becomes progressively more difficult as the target pore size shrinks to less than 5 µm. In accordance with the present disclosure, ALD coatings can be used to effectively shrink the pore size with a high degree of control of pore size and pore size distribution. While coatings deposited by ALD may be substantially thicker than employed in other applications, ALD affords the possibility of extraordinary control of the pore size and pore size distribution, while still achieving chemical resistance benefits, e.g., with ALD coatings of alumina.

Thus, ALD coating of sintered metal matrix materials may be applied at substantial thicknesses on the sintered metal matrix structure, with the coating thickness being of such magnitude as to reduce pore size in the coated metal matrix structure to very low levels, e.g., to sub-micron pore size levels.

Such approach may also be employed to effect the creation of filters with porosity gradients, such as a porosity gradient from a gas inlet face to a gas discharge face, wherein relatively larger sized pores are present at the gas inlet face and relatively smaller sized pores are present at the gas discharge face of the filter, with a porosity gradient between the respective faces of the filter. With such porosity gradient, the filter may for example be employed to capture large particles at an entrance side of the filter and smaller particles on the exit side of the filter, so that an overall highly effective filtration action is achieved.

The disclosure therefore contemplates filters comprising a porous material matrix coated with an ALD coating wherein the pore size of the porous metal matrix has been reduced by the ALD coating, e.g., by from 5% to 95% reduction in average pore size by the ALD coating in relation to a corresponding porous material matrix not coated with the ALD coating.

The disclosure also contemplates filters comprising a porous material matrix coated with an ALD coating, wherein the coating thickness is directionally varied to provide a corresponding pore size gradient in the filter, e.g., from an inlet phase to an outlet face of the filter, as above described.

A further aspect of the disclosure relates to a method of fabricating a porous filter, comprising coating a porous material matrix with an ALD coating, to reduce average pore size of the porous material matrix. The method may be utilized to achieve a predetermined reduction of average pore size of the porous material matrix, and/or a directionally varied pore size gradient in the porous material matrix.

The porous material matrix in any of the above aspects and embodiments may comprise a sintered metal matrix, e.g., of titanium, stainless steel, or other metal matrix material.

In another aspect, the disclosure relates to a solid vaporizer apparatus comprising a vessel defining an interior volume including support surface therein for solid material to be vaporized, wherein at least a portion of the support surface has an ALD coating thereon. The support surface may comprise interior surface of the vessel, such as the vessel wall surface, and/or floor of the vessel, or extended surface integrally formed with the wall and/or floor surfaces, so that the support surface comprises interior surface of the vessel, and/or the support surface may comprise surface of a support member in the interior volume, such as a trade providing support surface for the solid material to be vaporized. The tray may be coated partially or fully with the Al) coating. In other embodiments, the vessel may contain an array of vertically spaced apart trays, each providing support surface for the solid material. Each of such trays in the array may be coated with the ALD coating.

The vessel may be fabricated with the interior wall surface of the vessel that bounds the interior volume thereof being coated with the ALD coating. The ALD coating may for example comprise alumina, e.g., with thickness in a range of from 2 to 500 nm. The support surface coated by the ALD coating in any of the aforementioned embodiments may be a stainless steel surface. The vaporizer vessel itself may be formed of stainless steel. The vaporizer apparatus may be provided in a solids-loaded state, containing vaporizable solid material on the support surface of the vessel, e.g., on support surfaces of stacked trays in the interior volume of the vessel. The vaporizable solid material may be of any suitable type, and may for example comprise precursor material for vapor deposition or ion implantation operations. The vaporizable solid material may comprise an organometallic compound, or a metal halide compounds such as aluminum trichloride. It will be appreciated that the ALD coating applied to the support surface of the vessel may be specifically adapted to a particular vaporizable solid material. It will also be appreciated that the ALD coating may be applied to all interior surface in the interior volume of the vessel, including the wall and floor surface of the vessel as well as the surface presented by any tray or other support structure for the vaporizable solid that is disposed in the interior volume of the vessel.

The ensuing disclosure is directed to various illustrative examples of coated substrate articles, devices, and apparatus of the present disclosure, exemplifying specific features, aspects, and characteristics of the coating technology described herein.

Figure 15:
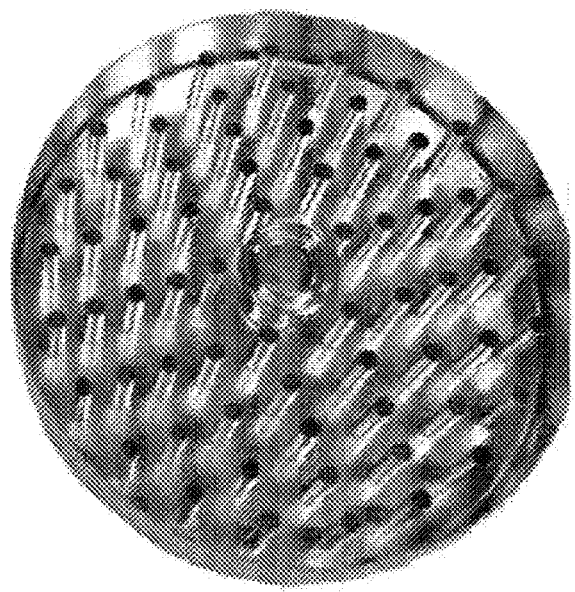
FIG. 15 is a perspective view of a stainless steel holder usefully employed in a vaporizer ampoule for aluminum trichloride ($AlCl_3$) solid precursor delivery for an aluminum process, in which the aluminum trichloride precursor is supported by the holder and volatilized to form aluminum trichloride precursor vapor for discharge from the vaporizer ampoule and transport through associated flow circuitry to the aluminum process.

Alumina coatings in accordance with the present disclosure may be applied to surfaces of holders utilized in vaporizer ampoules such as ampoules of the type shown in FIG. 3 hereof; as previously described herein. FIG. 15 is a perspective view of a stainless steel holder usefully employed in a vaporizer ampoule for aluminum trichloride ($AlCl_3$) solid precursor delivery for an aluminum process, in which the aluminum trichloride precursor is supported by the holder and volatilized to form aluminum trichloride precursor vapor for discharge from the vaporizer ampoule and transport through associated flow circuitry to the aluminum process. The aluminum process may for example be employed for metallization of a semiconductor device structure on and/or in a suitable wafer substrate.

Figure 16:
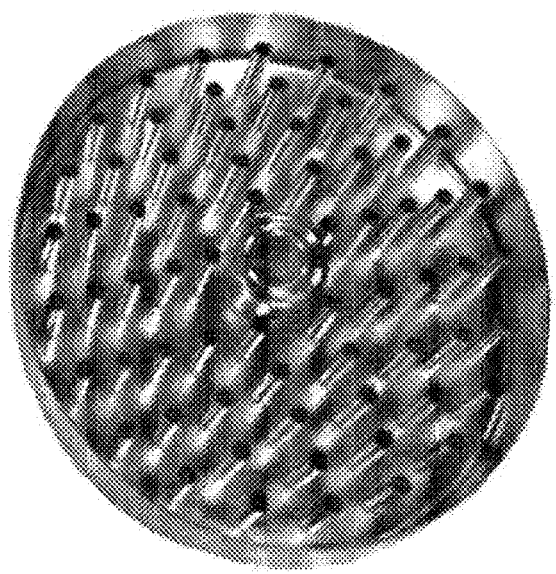
FIG. 16 is a perspective view of a stainless steel holder of the type shown in FIG. 15, as coated by atomic layer deposition with a coating of alumina thereon, so that the stainless steel surface is encapsulated by the alumina coating in the corrosive environment involving aluminum trichloride ($AlCl_3$) exposure to which the holder is subjected in use and operation of the vaporizer ampoule.

FIG. 16 is a perspective view of a stainless steel holder of the type shown in FIG. 15, as coated by atomic layer deposition with a coating of alumina thereon, so that the stainless steel surface is encapsulated by the alumina coating in the corrosive environment involving aluminum trichloride ($AlCl_3$) exposure to which the holder is subjected in use and operation of the vaporizer ampoule. By such alumina coating, the holder is protected against corrosion, and metals contamination of the precursor vapor is substantially reduced. In addition to such alumina coating of the holder, the entire interior surface of the vaporizer ampoule may likewise be coated, as well as exterior surfaces of the ampoule, to provide extended protection against the corrosive environment deriving from the processing of the aluminum trichloride ($AlCl_3$) solid precursor to volatilize same for generation of precursor vapor for the aluminum process, or for other usage.

The alumina coating on the surface of the holder and/or other vaporizer ampoule services may be of any suitable thickness, and may for example be in a thickness range of from 20 nm to 250 nm or more. In various embodiments, the coating thickness on the holder surfaces may be in a range of from 50 to 125 nm. It will be appreciated that any suitable thickness of the alumina coating may be applied by carrying out the corresponding vapor deposition operation for a corresponding number of deposition cycles and deposition times, with a suitable thickness being determinable by empirical methods as appropriate to provide a desired level of anti-corrosion protection to the metal surface.

Figure 17:
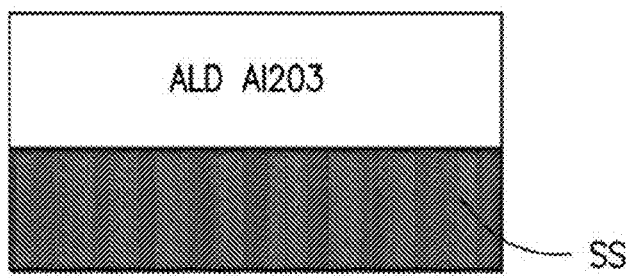
FIG. 17 is a schematic elevation view of an alumina coating applied by atomic layer deposition to a stainless steel substrate, to provide corrosion resistance, prevent chemical reaction with the substrate, and reduce metals contamination in use.

FIG. 17 is a schematic elevation view of the alumina coating applied by atomic layer deposition to the stainless steel substrate, as described above in application to the solid precursor holder utilized in the vaporizer ampoule. The alumina coating provides corrosion resistance, prevents chemical reaction with the substrate, and reduces metals contamination in use of the vaporizer for aluminum trichloride precursor vapor generation.

Figure 18:
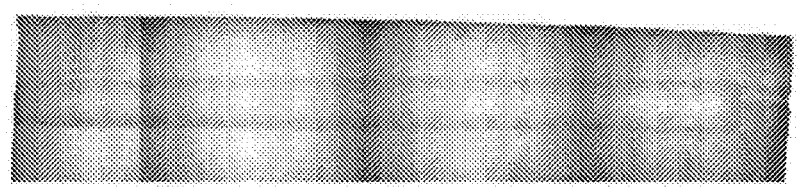
FIG. 18 shows channels of a plasma etch apparatus coated with yttria ($Y_2O_3$).

In another application, yttria coatings may be applied to surfaces of etching apparatus or apparatus components, e.g., surfaces of injector nozzles used in plasma etch equipment. FIG. 18 shows channels of a plasma etch apparatus coated with yttria ($Y_2O_3$). Yttria provides an etch resistant coating that is suitable for surfaces and parts of complicated shape, such as high aspect ratio features. When deposited by atomic layer deposition, yttria forms a dense, conformal, pin-hole free coating that is resistant to etching, and provides substantially reduced particle shedding and erosion in relation to surfaces lacking such yttria coating.

Figure 19:
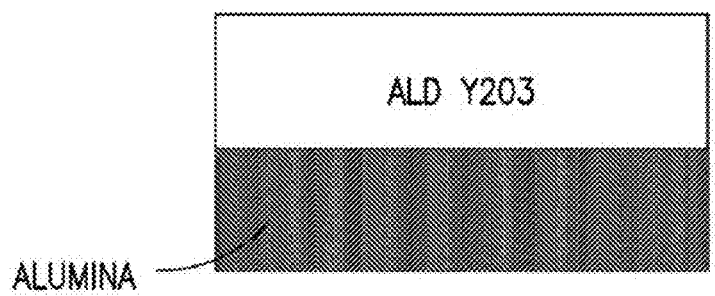
FIG. 19 is a schematic elevation view of an yttria coating applied by atomic layer deposition over alumina.

Yttria coatings may be applied by atomic layer deposition over alumina, as in the schematic elevation view of FIG. 19. In application to plasma etching equipment and equipment components, the ALD yttria layer provides enhanced corrosion-resistance and etch-resistance, protecting the underlying surface against deleterious plasma exposure, such as exposure to chloro- and fluoro- and other halogen-based plasmas. The ALD yttria layer thereby reduces generation of unwanted particles, and increases the lifetime of parts of the plasma etching equipment whose surfaces are coated with the yttria coating.

In another application, load lock components employed for etch chamber apparatus are exposed in use to residual etch chemistries from the etch chamber, resulting in severe corrosion of metal components. An example is a diffuser plate, which may be constructed of stainless steel or other metal or metal alloy, with a filter membrane, formed for example of nickel or other metal or metal alloy. Such diffuser plate assembly may be coated with an alumina coating to encapsulate and protect the diffuser plate and filter membrane. By complete encapsulation of the filter membrane, corrosion of the membrane is prevented.

Figure 20:
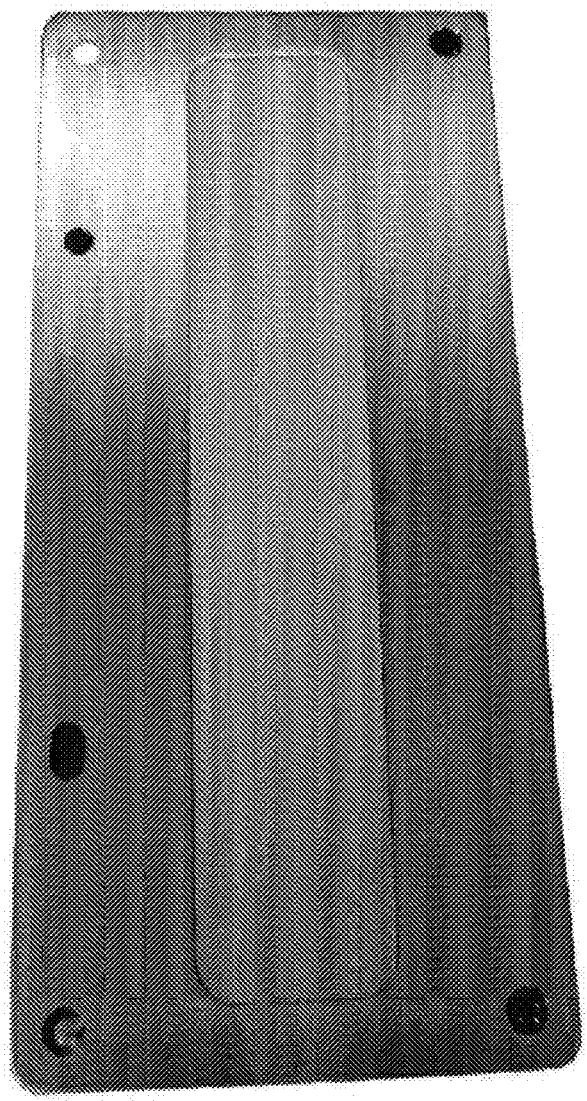
FIG. 20 is a photograph of a diffuser plate assembly, including a stainless steel frame and a nickel filter membrane, as coated with an alumina coating.
Figure 21:
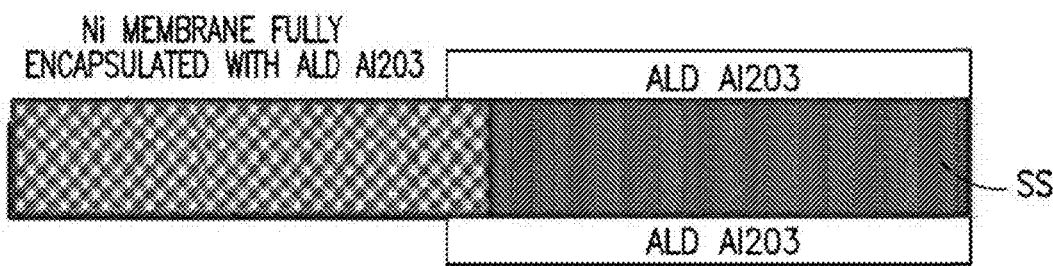
FIG. 21 is a schematic elevation view of the diffuser plate assembly, in which the stainless steel frame and nickel membrane are encapsulated with ALD alumina.

FIG. 20 is a photograph of a diffuser plate assembly, including a stainless steel frame and a nickel filter membrane, as coated with an alumina coating. FIG. 21 is a schematic elevation view of the diffuser plate assembly, in which the stainless steel frame and nickel membrane are encapsulated with ALD alumina. The ALD coating provides a corrosion resistant and etch resistant layer that protects against deleterious chemistries, e.g., hydrogen bromide-based chemistries, reducing particles, and increasing the lifetime of the assembly.

Another application relates to semiconductor process equipment that is exposed to chlorine-based precursors from ALD processing, and to fluorine-based plasmas from chamber cleaning operations. In such applications, yttria coatings may be employed to provide good etch resistance and to coat parts with complicated shapes. One approach in such applications is the use of a combination of physical vapor deposition (PVD) and atomic layer deposition (ALD) of yttria, with ALD being employed for thinner coating of high aspect ratio features and critical elements, and thicker coating of PVD for the remainder of the part. In such application, the yttria ALD layer provides corrosion-resistance and etch-resistance, protection against fluorine-based chemistries and fluorine-based plasmas, reducing particle generation and increasing lifetime of parts that are coated with the protective yttria coating.

A further application relates to coating of quartz envelopes structures, such as bulbs of ultraviolet (UV) curing lamps that are used in back end of line (BEOL) and front end of line (FEOL) UV curing operations. In the operation of UV lamps, such as those in which the bulb is fabricated of quartz, mercury will diffuse into the quartz during operation at the high temperatures involved, e.g., on the order of 1000° C., and such mercury diffusion will result in degradation of the UV lamp and substantial shortening of its operational service life. To combat such mercury migration into the quartz envelope (bulb) material, alumina and/or yttria is coated on the interior surface of the bulb to provide a diffusion barrier layer against incursion of mercury into the quartz envelope material.

Figure 22:
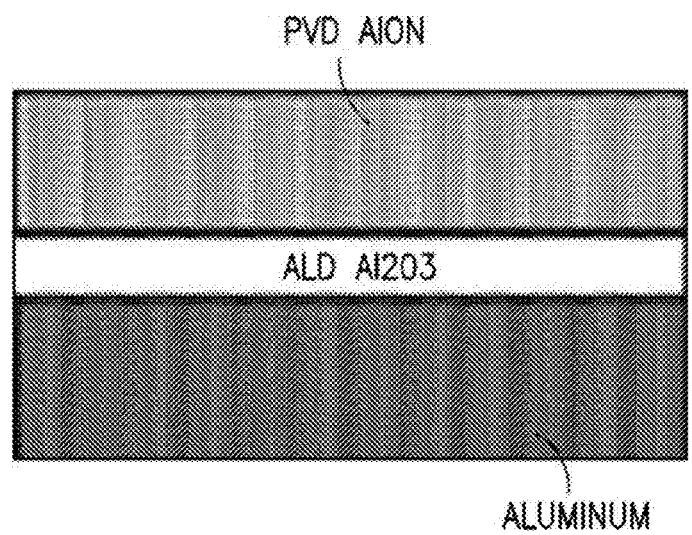
FIG. 22 is a photograph of a toroidal quartz UV bulb, whose interior surface is coated with an alumina coating, as a diffusion barrier layer against mercury diffusion, to increase the operating service life of the UV lamp in which such bulb is employed.

FIG. 22 is a photograph of a toroidal quartz UV bulb, whose interior surface is coated with an alumina coating, as a diffusion barrier layer against mercury diffusion, to increase the operating service life of the UV lamp in which such bulb is employed.

More generally, alumina coatings may be employed to overcoat and encapsulate metal components of various types, to impart corrosion resistance, prevent chemical reaction with the substrate, and to reduce metals contamination, so that operating service life of components, such as gas lines, valves, tubes, housings, and the like, are correspondingly extended. By use of atomic layer deposition, interior surfaces of parts can be coated, including parts with complex interior surface geometry, and layers of alumina or other protective coatings may be employed to provide dense, pin-hole free and conformal protective layers over the substrate surface.

Another application of protective coatings of the present disclosure is the protective coating of plasma source surfaces, such as are used in semiconductor manufacturing, and manufacture of flat-panel displays, as well as solar panel manufacturing. Such plasma sources may be of any suitable type, and may for example generate ammonia plasmas, hydrogen plasmas, nitrogen trifluoride plasmas, and plasmas of other varieties. The protective coatings can be utilized in place of anodizing surfaces of plasma-wetted parts, to provide enhanced plasma etch resistance, e.g., greater than 1000 hours exposure to $NF_3$ plasma, while accommodating hydrogen ($H^*$) and fluorine ($F^*$) surface recombination, and high electrical standoff voltages, e.g., greater than 1000 V.

Figure 23:
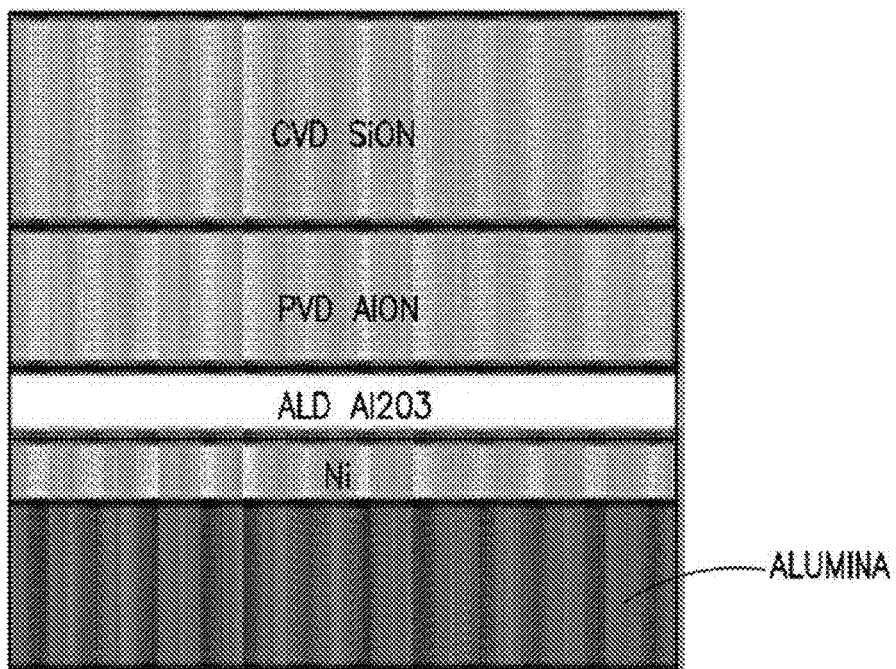
FIG. 23 is a schematic perspective view of a plasma source apparatus, which may for example be formed of aluminum, in which the plasma channel and the water channel of the apparatus are coated with protective coatings.
Figure 24:
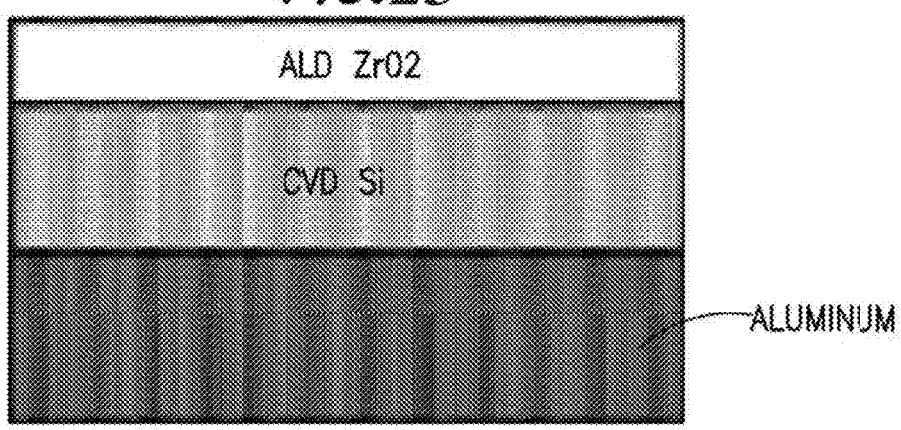
FIG. 24 is a schematic elevation view of a coating structure, including an aluminum substrate, an ALD coating of alumina, and a PVD coating of AlON.

FIG. 23 is a schematic perspective view of a plasma source apparatus, which may for example be formed of aluminum, or an aluminum compound such as aluminum oxynitride, in which the plasma channel and the water channel of the apparatus are coated with coatings. The plasma channel coating and the water channel coating 48 may comprise an ALD coating of alumina, over which is deposited a physical vapor deposition (PVD) coating of aluminum oxynitride (AlON), as shown in the schematic elevation view of FIG. 24, showing the aluminum substrate, the ALD coating of alumina, and the PVD coating of AlON. The thicknesses of the respective alumina and aluminum oxynitride coatings may be of any suitable thickness. By way of example, the thickness of the alumina coating may be in a range of from 0.05 to 5 μm, and the thickness of the PVD coating may be in a range of from 2 to 25 μm. In a specific embodiment, the alumina coating has a thickness of 1 μm, and the PVD AlON coating has a thickness of 10 μm. In the structure, the PVD AlON coating provides the apparatus with etch resistance and plasma surface recombination capability, and the alumina coating, in addition to providing etch resistance provides an electrical standoff coating.

Figure 25:
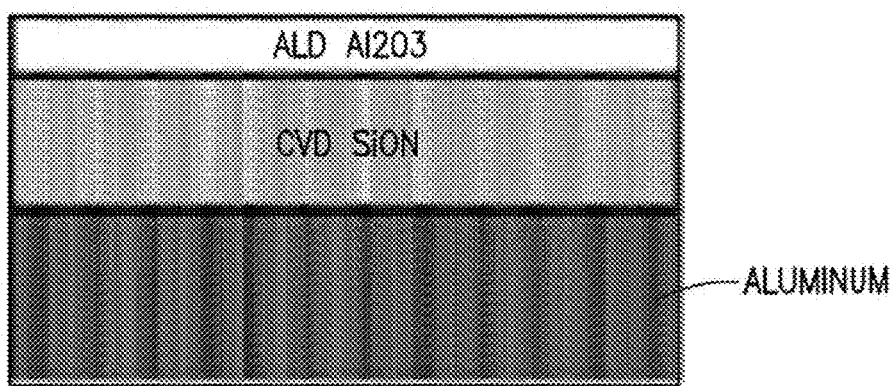
FIG. 25 is a schematic elevation view of the layer structure of a dielectric stack useful for hot chuck components, in which an alumina substrate has an electrode metal thereon, on which is an electrical stand-off layer of ALD alumina, on which is a PVD coating of aluminum oxynitride, on which is a layer of chemical vapor deposition (CVD) deposited silicon oxynitride (SiON).

A further application relates to dielectric stacks for hot chuck components, which may have a layer structure as shown in FIG. 25. As shown, an alumina substrate has an electrode metal, e.g., nickel, thereon, on which is an electrical stand-off layer of ALD alumina. Deposited on the alumina layer is a PVD coating of aluminum oxynitride, and deposited on the AlON layer is a layer of chemical vapor deposition (CVD) deposited silicon oxynitride (SiON). In this layer structure, the CVD SiON layer provides a clean way for contact surface and electrical spacer, the PVD AlON layer provides a coefficient of thermal expansion (CTE) buffer layer, the ALD layer of alumina provides an electrical stand-off layer, and the nickel provides an electrode metal layer, on the alumina substrate.

Figure 26:
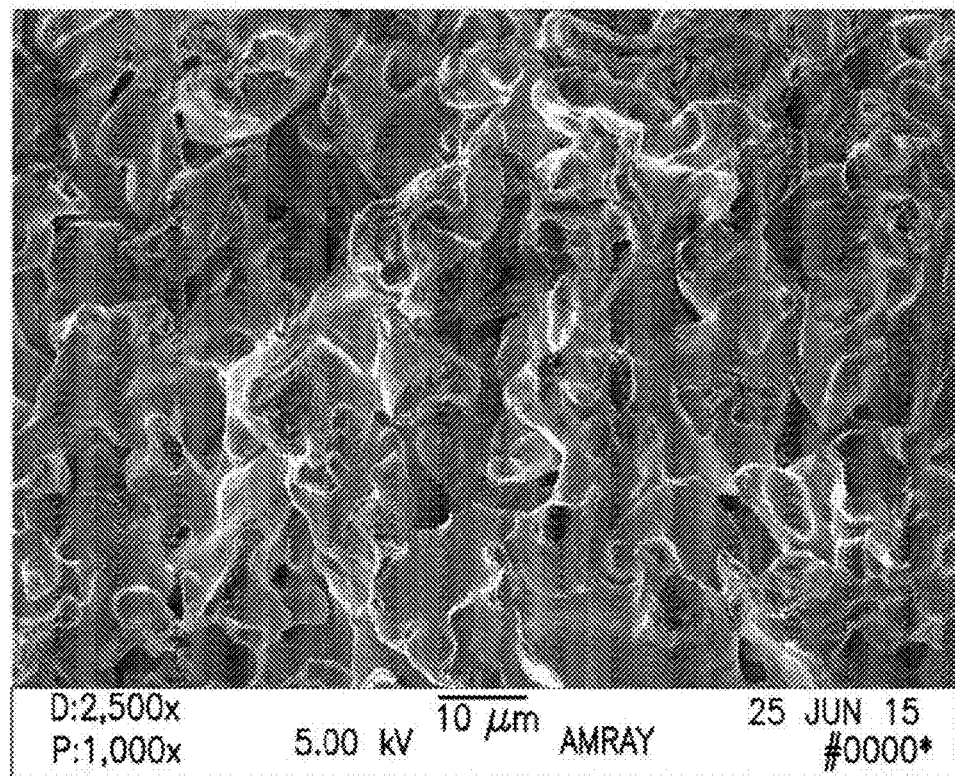
FIG. 26 is a schematic elevation view of a multilayer stack including a chemical vapor deposition-applied layer of silicon on an aluminum substrate, with an ALD layer of zirconia on the CVD Si layer.
Figure 27:
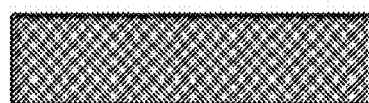
FIG. 27 is a schematic elevation view of a multilayer stack including a CVD layer of silicon oxynitride on an aluminum substrate, and an ALD layer of alumina on the CVD SiON coating layer.

A still further application relates to plasma activation chuck components of plasma activation chambers, in which aluminum parts are coated with a multilayer stack including the multilayer stacks shown in FIGS. 26 and 27. The multilayer stack of FIG. 26 includes a chemical vapor deposition-applied layer of silicon on the aluminum substrate, with an ALD layer of zirconia on the CVD Si layer. In this multilayer stack, the ALD layer of zirconia functions to provide a clean, dense way for contact surface, serving as a diffusion barrier layer, and an electrical standoff. The CVD silicon layer provides a clean buffer layer on the aluminum substrate. The multilayer stack of FIG. 27 includes a CVD layer of silicon oxynitride on the aluminum substrate, and an ALD layer of alumina on the CVD SiON coating layer, wherein the ALD alumina layer functions as an electrical stand-off layer, a diffusion barrier layer, and a layer providing a clean, dense way for contact surface. The CVD SiON layer provides a clean buffer layer in the multilayer coating structure.

A further application of the coating technology of the present disclosure relates to coating of porous matrix and filter articles, in which coatings such as alumina may be deposited by atomic layer deposition, which enables independent control of penetration depth and coating thickness in the porous matrix or filter material. Either partial alumina coating penetration or full alumina coating penetration may be employed, depending on the article and its specific end use.

Figure 28:
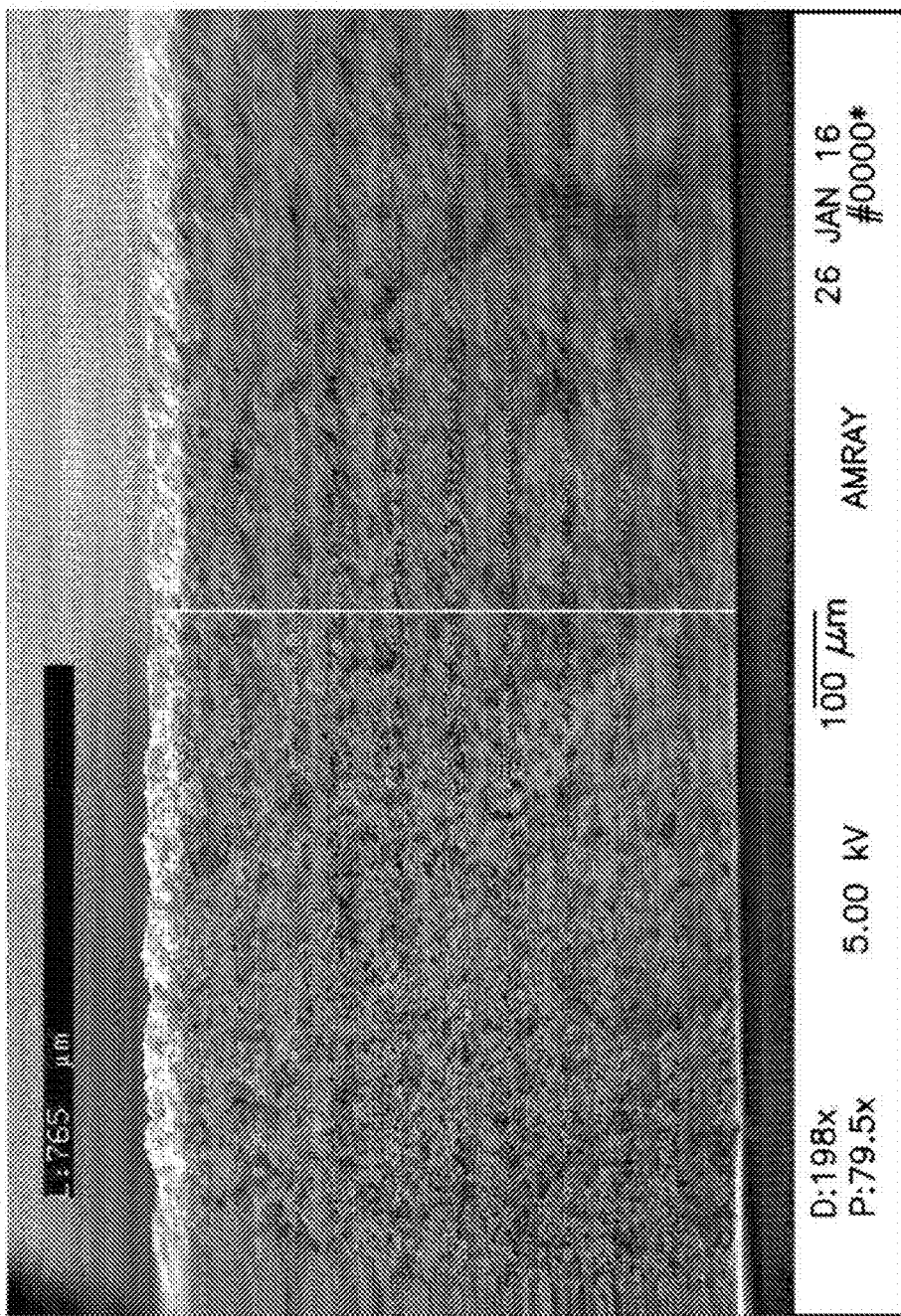
FIG. 28 is a micrograph of porous material having a 1.5 mm wall thickness and pore size of 2-4 μm, coated with alumina by atomic layer deposition.
Figure 29:
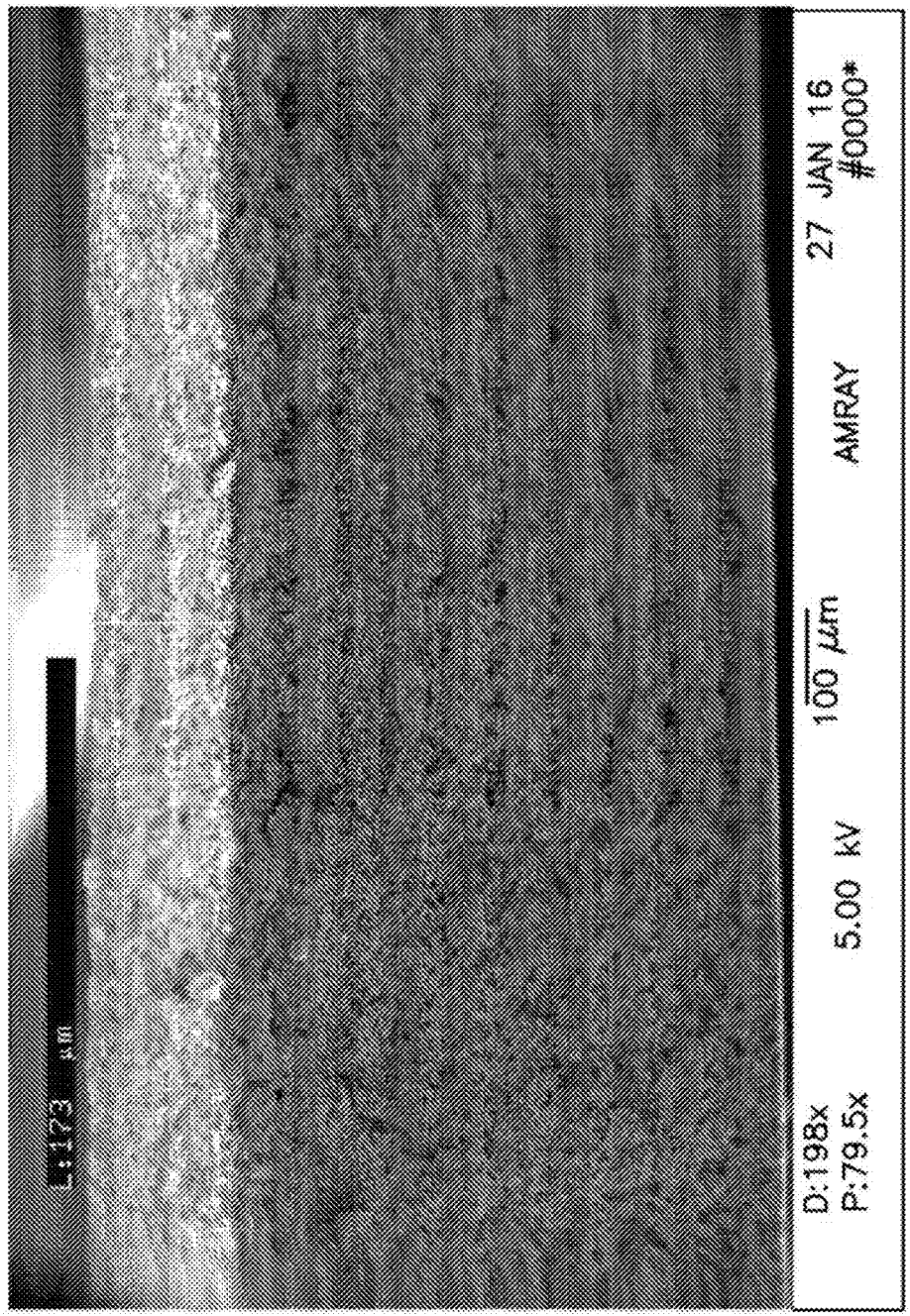
FIG. 29 is a schematic representation of an encapsulated membrane, comprising a membrane formed of stainless steel, nickel, titanium, or other suitable material, which has been fully encapsulated with alumina deposited by ALD.

FIG. 28 is a micrograph of porous material having a 1.5 mm wall thickness and pore size of 2-4 μm, coated with alumina by atomic layer deposition. FIG. 29 is a schematic representation of an encapsulated membrane, comprising a membrane formed of stainless steel, nickel, titanium, or other suitable material, which has been fully encapsulated with alumina deposited by ALD, to provide the encapsulated membrane with corrosion resistance and etch resistance, protection against chemical attack, reduction of particle generation, and reduction of metals contamination.

The use of atomic layer deposition, as indicated, provides an ability to independently control coating penetration depth and coating thickness. This ability is usefully employed to control pore size and flow restriction of ultra-fine membranes, such as for example those with nominal pore size in a range of from 20 nm to 250 nm, e.g., a nominal pore size on the order of 100 nm.

FIG. 30 is a photomicrograph of a coated filter, wherein the coating is alumina, having a coating penetration depth of 35 µm. FIG. 31 is a photomicrograph of a coated filter, wherein the coating is alumina, having a coating penetration depth of 175 µm.

Consistent with the preceding disclosure herein, the present disclosure relates in one aspect to a solid vaporizer apparatus comprising a container defining therein an interior volume, an outlet configured to discharge precursor vapor from the container, and support structure in the interior volume of the container adapted to support solid precursor material thereon for volatilization thereof to form the precursor vapor, wherein the solid precursor material comprises aluminum precursor, and wherein at least part of surface area in the interior volume is coated with an alumina coating. In various embodiments of such solid vapor apparatus, the surface area may comprise at least one of surface area of the support structure, and surface area of the container in said interior volume. In other embodiments, the surface area may comprise surface area of the support structure, and surface area of the container in said interior volume. In still other embodiments, the surface area in the interior volume that is coated with an alumina coating, comprises stainless steel. In various implementations of the solid vaporizer apparatus, the alumina coating may have thickness in a range of from 20 to 125 nm. the alumina coating may for example comprise an ALD alumina coating in any of the foregoing aspects and embodiments.

The disclosure in another aspect relates to a method of enhancing corrosion resistance of a stainless steel structure, material, or apparatus that in use or operation is exposed to aluminum halide, said method comprising coating said stainless steel structure, material, or apparatus with an alumina coating. The alumina coating in such method may for example have thickness in a range of from 20 to 125 nm. The alumina coating may for example be applied by atomic layer deposition.

In a further aspect, the disclosure relates to a semiconductor processing etching structure, component, or apparatus that in use or operation is exposed to etching media, said structure, component, or apparatus being coated with a coating comprising a layer of yttria, wherein the layer of yttria optionally overlies a layer of alumina in said coating. The etching structure, component, or apparatus may for example comprise an etching apparatus injector nozzle.

Another aspect of the disclosure relates to a method of enhancing corrosion resistance and etch resistance of a semiconductor processing etching structure, component, or apparatus that in use or operation is exposed to etching media, said method comprising coating the structure, component, or apparatus with a coating comprising a layer of yttria, wherein the layer of yttria optionally overlies a layer of alumina in said coating.

Still another aspect of the disclosure relates to an etch chamber diffuser plate comprising a nickel membrane encapsulated with an alumina coating. In such etch chamber diffuser plate, the alumina coating may comprise an ALD alumina coating.

A further aspect of the disclosure relates to a method of enhancing corrosion resistance and etch resistance of an etch chamber diffuser plate comprising a nickel membrane, comprising coating the nickel membrane with an encapsulating coating of alumina. The coating of alumina may for example comprise an ALD coating.

The disclosure in another aspect relates to a vapor deposition processing structure, component, or apparatus that in use or operation is exposed to halide media, said structure, component, or apparatus being coated with a coating of yttria comprising an ALD base coating of yttria, and a PVD overcoating of yttria. In such structure, component, or apparatus, the surface that is coated with the ALD base coating of yttria, and the PVD overcoating of yttria, may comprise aluminum.

A further aspect of the disclosure relates to a method of enhancing corrosion resistance and etch resistance of a vapor deposition processing structure, component, or apparatus that in use or operation is exposed to halide media, said method comprising coating the structure, component, or apparatus with a coating of yttria comprising an ALD base coating of yttria, and a PVD over coating of yttria. As noted above, the structure, component, or apparatus may comprise aluminum surface that is coated with the coating of yttria.

Another aspect the disclosure relates to a quartz envelope structure coated on an interior surface thereof with an alumina diffusion barrier layer.

A corresponding aspect of the disclosure relates to a method of reducing diffusion of mercury into a quartz envelope structure susceptible to such diffusion in operation thereof said method comprising coating an interior surface of the quartz envelope structure with an alumina diffusion barrier layer.

The disclosure in a further aspect relates to a plasma source structure, component, or apparatus that in use or operation is exposed to plasma and voltage exceeding 1000 V, wherein plasma-wetted surface of said structure, component or apparatus is coated with an ALD coating of alumina, and said alumina coating is overcoated with a PVD coating of aluminum oxynitride. The plasma-wetted surface may for example comprise aluminum or aluminum oxynitride.

A further aspect of the disclosure relates to a method of enhancing service life of a plasma source structure, component, or apparatus that in use or operation is exposed to plasma and voltage exceeding 1000 V, said method comprising coating plasma-wetted surface of said structure, component or apparatus with an ALD coating of alumina, and over coating said alumina coating with a PVD coating of aluminum oxynitride. As indicated above, the plasma-wetted surface may comprise aluminum or aluminum oxynitride.

An additional aspect of the disclosure relates to a dielectric stack, comprising sequential layers including a base layer of alumina, a nickel electrode layer thereon, an ALD alumina electrical stand-off layer on the nickel electrode layer, a PVD aluminum oxynitride thermal expansion buffer layer on the ALD alumina electrical stand-off layer, and a CVD silicon oxynitride wafer contact surface and electrical spacer layer on the PVD aluminum oxynitride thermal expansion buffer layer.

A plasma activation structure, component, or apparatus is contemplated in another aspect of the disclosure, comprising aluminum surface coated with one of the multilayer coatings of (i) and (ii): (i) a base coat of CVD silicon on the aluminum surface, and a layer of ALD zirconia on the base coat of CVD silicon; and (ii) a base coat of CVD silicon oxynitride on the aluminum surface, and a layer of ALD alumina on the base coat of CVD silicon oxynitride.

A corresponding method is contemplated for reducing particle formation and metal contamination for an aluminum surface of a plasma activation structure, component, or apparatus, said method comprising coating the aluminum surface with one of the multilayer coatings of (i) and (ii); (i) a base coat of CVD silicon on the aluminum surface, and a layer of ALD zirconia on the base coat of CVD silicon; and (ii) a base coat of CVD silicon oxynitride on the aluminum surface, and a layer of ALD alumina on the base coat of CVD silicon oxynitride.

The disclosure contemplates, in another aspect, a porous matrix filter comprising a membrane formed of stainless steel, nickel, or titanium, wherein the membrane is encapsulated with alumina to a coating penetration depth in a range of from 20 to 2000 μm. More specifically, in various embodiments, the porosity may have nominal pore size in a range of from 10 to 1000 nm.

Another aspect of the disclosure relates to a method of making a porous matrix filter comprising encapsulating a membrane formed of stainless steel, nickel, or titanium with alumina to a coating penetration depth in a range of from 20 to 2000 μm. in a specific embodiment of such method, the encapsulating comprises ALD of the alumina, and the method is conducted to provide porosity in the porous matrix filter having nominal pore size in a range of from 10 to 1000 nm.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A method of forming a patterned ALD coating on a substrate part, said method comprising:
   uniformly coating the part with an ALD coating of aluminum oxide having a thickness in a range from 5 nm to 5 μm;
   masking an area of the ALD coating of the coated part with a non-coating physical mask comprising a sealed sheet or fixture; and
   etching back unwanted coating material through the physical mask, wherein the substrate part is a component of semiconductor manufacturing equipment, the substrate part is stainless steel, and the substrate part comprises at least one high aspect ratio feature selected from the group consisting of holes, channels, 3-dimensional features, hardware, screws, nuts, porous membranes, filters, 3-dimensional network structures, and structures with connected pore matrices.

2. The method of claim 1, wherein the etching back comprises an operation selected from the group consisting of mechanical treatment, bead blast, physical treatment, plasma ion treatment, chemical treatment, plasma etch, and wet etch.

3. The method of claim 1, wherein the ALD coating of aluminum oxide has a thickness in a range of 20 nm to 125 nm.

* * * * *